(12) United States Patent
Yamahira

(10) Patent No.: US 11,025,850 B2
(45) Date of Patent: Jun. 1, 2021

(54) SOLID-STATE IMAGE-CAPTURING DEVICE AND METHOD FOR DRIVING SOLID-STATE IMAGE-CAPTURING DEVICE

(71) Applicant: Panasonic Intellectual Property Management Co., Ltd., Osaka (JP)

(72) Inventor: Seiji Yamahira, Kyoto (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 419 days.

(21) Appl. No.: 15/995,614

(22) Filed: Jun. 1, 2018

(65) Prior Publication Data

US 2018/0278877 A1    Sep. 27, 2018

Related U.S. Application Data

(63) Continuation of application No. PCT/JP2016/005046, filed on Dec. 2, 2016.

(30) Foreign Application Priority Data

Dec. 7, 2015  (JP) .................................. 2015-238982

(51) Int. Cl.
*H01L 27/00*    (2006.01)
*H04N 5/378*    (2011.01)
(Continued)

(52) U.S. Cl.
CPC ....... *H04N 5/378* (2013.01); *H01L 27/14609* (2013.01); *H04N 5/355* (2013.01); *H04N 5/374* (2013.01); *H04N 5/3742* (2013.01)

(58) Field of Classification Search
CPC .. H04N 5/3742; H04N 5/378; H04N 5/37452; H04N 5/355; H04N 5/374; H01L 27/14609
(Continued)

(56) References Cited

U.S. PATENT DOCUMENTS 8,822,900 B2    9/2014 Richardson et al.
2002/0024058 A1    2/2002 Marshall et al.
(Continued)

FOREIGN PATENT DOCUMENTS

EP    1 746 820 A1    1/2007
EP    2 770 730 A1    8/2014
(Continued)

OTHER PUBLICATIONS

Office Action along with a search report dated Dec. 16, 2019 issued for the corresponding Chinese Patent Application No. 201680070909.1; with English translation.
(Continued)

*Primary Examiner* — Georgia Y Epps
(74) *Attorney, Agent, or Firm* — McDermott Will and Emery LLP

(57) ABSTRACT

A solid-state image-capturing device includes a pixel array including a plurality of pixel circuits arranged in rows and columns. Each pixel circuit includes: a photoelectric conversion element that generates an electric charge through photoelectric conversion between a bias terminal and a first node, and amplifies the electric charge according to a bias voltage applied via the bias terminal and the first node; a transfer circuit that electrically connects the first node to a second node according to a first control signal; a reset circuit that applies a reset voltage to the second node according to a second control signal; an output circuit that reads out a voltage of the second node according to a third control signal; and an analog memory that is electrically connected to the second node according to a fourth control signal.

14 Claims, 20 Drawing Sheets

(51) Int. Cl.
   *H04N 5/374* (2011.01)
   *H01L 27/146* (2006.01)
   *H04N 5/355* (2011.01)
(58) Field of Classification Search
   USPC ....................................................... 250/208.1
   See application file for complete search history.

(56) References Cited

U.S. PATENT DOCUMENTS

| | | |
|---|---|---|
| 2006/0163454 A1 | 7/2006 | Akiba et al. |
| 2008/0231738 A1* | 9/2008 | Iida ................... H01L 27/14645 348/308 |
| 2012/0205522 A1* | 8/2012 | Richardson ............ H04N 5/378 250/214.1 |
| 2013/0112848 A1* | 5/2013 | Lin ................... H04N 5/37455 250/206 |
| 2014/0014817 A1* | 1/2014 | Motonaga .............. H04N 5/378 250/208.1 |
| 2014/0124652 A1 | 5/2014 | Dutton et al. |
| 2014/0124653 A1 | 5/2014 | Dutton et al. |
| 2015/0189210 A1* | 7/2015 | Shimizu ................. H04N 5/378 348/301 |
| 2016/0216381 A1 | 7/2016 | Nishihara et al. |
| 2018/0341009 A1* | 11/2018 | Niclass ................. G01S 7/4815 |

FOREIGN PATENT DOCUMENTS

| | | |
|---|---|---|
| JP | 2005-517300 A | 6/2005 |
| JP | 2013-243783 A | 12/2013 |
| JP | 2014-139564 A | 7/2014 |
| WO | 03/067663 A1 | 8/2003 |

OTHER PUBLICATIONS

Extended Search Report issued in European Patent Application No. 16872612.3, dated Nov. 16, 2018.
International Search Report issued in Application No. PCT/JP2016/005046 dated Feb. 14, 2017, with English translation.

\* cited by examiner

SOLID-STATE IMAGE-CAPTURING DEVICE AND METHOD FOR DRIVING SOLID-STATE IMAGE-CAPTURING DEVICE

CROSS REFERENCE TO RELATED APPLICATIONS

This application is a U.S. continuation application of PCT International Patent Application Number PCT/JP2016/005046 filed on Dec. 2, 2016, claiming the benefit of priority of Japanese Patent Application Number 2015-238982 filed on Dec. 7, 2015, the entire contents of which are hereby incorporated by reference.

BACKGROUND

1. Technical Field

The present disclosure relates to a solid-state image-capturing device, and more particularly to a solid-state image-capturing device in which an electron-multiplication type photoelectric conversion element such as an avalanche photodiode is used.

2. Description of the Related Art

In recent years, a solid-state image-capturing device has been proposed in which pixel circuits each including an avalanche photodiode are arranged in an array. The avalanche photodiode can multiply electric charges generated by photoelectrically converting incident photons by applying a voltage that is greater than or equal to the breakdown voltage, and provide an output signal that has a large amplitude. For this reason, the avalanche photodiode is suitable for imaging in an environment in which the number of photons is small. On the other hand, in an environment in which the number of photons is large, because the output signal is saturated, there is a problem in that the analog gradation of the Signal cannot obtained even when a plurality of incident photons are incident.

As a means for solving the above-described problem, a multimode photo-detector shown in FIG. 15 is proposed (U.S. Pat. No. 8,822,900).

The multimode photo-detector shown in FIG. 15 includes: avalanche photodiode PD that is driven by application of voltage Vb; first output circuit 910 that includes first source follower transistor M92 that reads out the voltage of avalanche photodiode PD, and first switch transistor M93; and second output circuit 920 that includes capacitor C that is connected to one end of first source follower transistor M92, second source follower transistor M94 that reads out the voltage of capacitor C, and second switch transistor M95.

A brief description will be given of a feature of the operation of the multimode photo-detector shown in FIG. 15.

[Electric Charge Accumulation Mode]

When voltage Vb is less than or equal to the breakdown voltage of the avalanche photodiode, a number of electric charges that is proportional to the number of incident photons are generated in the avalanche photodiode, and output signal Vx is output from first output circuit 910 that includes first source follower transistor M92 and first switch transistor M93. This operation will be referred to as "electric charge accumulation mode".

[Photon Counting Mode]

When voltage Vb is greater than or equal to the breakdown voltage of the avalanche photodiode, a number of electric charges obtained by multiplying the number of incident photons are generated in the avalanche photodiode, and first source follower transistor M92 is in a conductive state. The electric charges that have been accumulated in advance in capacitor C are discharged by a constant amount via source follower transistor M92. That is, for each optical detection event, a constant amount of electric charges are discharged from capacitor C, and after a certain period of time, output signal Vtac is output from second output circuit 920 that includes second source follower transistor M94 and second switch transistor M95. This operation will be referred to as "photon counting mode".

By combining the electric charge accumulation mode and the photon counting mode as described above, it is possible to perform imaging in a wide variety of environments so as to correspond to a various number of incident photons.

Also, although not shown, a method has also been proposed in which a transistor is added in series to first source follower transistor M92 disclosed in U.S. Pat. No. 8,822,900 so as to control the electric charges discharged during the photon counting mode (U.S. Patent Application Publication No. 2014/0124653).

SUMMARY

However, the conventional example disclosed in U.S. Pat. No. 8,822,900 requires output circuit 910 for the electric charge accumulation mode and output circuit 920 for the photon counting mode, which increases the size of the pixel circuit, which poses a problem when the number of pixels is increased. Also, the conventional examples disclosed in U.S. Pat. No. 8,822,900 and U.S. Patent Application Publication No. 2014/0124653 are also problematic in that a large number of constituent transistors are required for the photon counting mode, which increases the size of the pixel circuit.

According to one aspect of the present disclosure, a solid-state image-capturing device includes: a photoelectric conversion element that generates an electric charge through photoelectric conversion between a bias terminal and a first node, and multiplies the electric charge according to a bias voltage applied via the bias terminal and the first node; a transfer circuit that electrically connects the first node to a second node according to a first control signal; a reset circuit that applies a reset voltage to the second node according to a second control signal; an output circuit that reads out a voltage of the second node according to a third control signal; and an analog memory that electrically connects to the second node according to a fourth control signal.

This configuration enables shared use of the output circuit between the electric charge accumulation mode and the photon counting mode. Accordingly, the number of structural elements that constitute each pixel circuit can be reduced, as a result of which it is possible to develop a solid-state image-capturing device with a reduced pixel circuit area and a large number of pixels.

Also, according to another aspect of the present disclosure, the solid-state image-capturing device may further include a control circuit that generates the first control signal, the second control signal, the third control signal, the fourth control signal, and a bias terminal voltage that is applied to the bias terminal. In driving in which the photoelectric conversion element multiplies the electric charge, the control circuit may supplement the electric charge multiplied by the photoelectric conversion element for each optical detection event from the analog memory to the photoelectric conversion element via the transfer circuit, and the output circuit may read out the voltage of the second node according to the electric charge accumulated in the analog memory before and after the supplement of the electric charge.

With this configuration, the electric charges generated by the photoelectric conversion element that is configured by, for example, an avalanche photodiode are supplemented directly to the photoelectric conversion element from the analog memory in which the electric charges have been accumulated in advance. Accordingly, unlike known circuit configurations of the background art techniques, it is possible to control a very small amount of electric charges without adding an additional control transistor for discharging, as a result of which it is possible to develop a solid-state image-capturing device with a reduced pixel circuit area and a large number of pixels. By repeating the above-described operations, the number of photon incident events is converted to the voltage of the analog memory, and it is thereby possible to perform photon counting.

Also, a diode, a bipolar transistor, or a clamp circuit such as a resistor that can clamp at a desired bias may be provided at one end of the avalanche photodiode. With this configuration, when the avalanche photodiode performs electron-multiplication, the voltage at the one end of the avalanche photodiode can be set to the desired bias, and it is possible to control analog gradation at the time of photon counting.

Also, with the method for driving the transistor provided between the avalanche photodiode and the analog memory, it is possible to perform two types of photon counting modes. To be specific, it is possible to perform an event-driven type photon counting mode in which photon counting is performed in response to a photon incident event, and a pulse-controlled type photon counting mode in which photon counting is performed in synchronization with the control signal that is activated at a regular interval.

Also, because a plurality of analog memories are included, it is possible to change the dynamic range for photon counting, and therefore imaging suitable for the environment can be performed.

Also, according to another aspect of the present disclosure, the control circuit may perform: global reset of simultaneously setting the first nodes of the plurality of pixel circuits arranged in a plurality of rows to an initial voltage; global exposure of, after the global reset, performing photoelectric conversion in the photoelectric conversion elements of the plurality of pixel circuits during a same period; rolling readout of reading out, for each row, the voltages of the second nodes according to the electric charges accumulated in the analog memories of the plurality of pixel circuits in a preceding frame while performing the global exposure; and global transfer of, after the rolling readout, simultaneously transferring the electric charges accumulated in the first nodes of the plurality of pixel circuits in a current frame to the analog memories.

With this configuration, by using the analog memory as a temporary storage memory, imaging using a global electronic shutter can be performed.

Also, a series of operations of resetting the voltage of the avalanche photodiode, performing exposure, and transferring the electric charges generated by the avalanche photodiode to the analog memory are simultaneously performed on a plurality of rows or all rows. Accordingly, the voltages of the analog memories stored in the preceding frame are read out for each row in the current frame, and thus the readout time can be apparently eliminated, and the reduction in the frame rate can be suppressed.

The solid-state image-capturing device according to the present disclosure enables shared use of the output circuit between the electric charge accumulation mode and the photon counting mode, as a result of which the number of structural elements that constitute each pixel circuit can be reduced, and it is possible to develop a solid-state image-capturing device with a reduced pixel circuit area and a large number of pixels.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Figure 1:
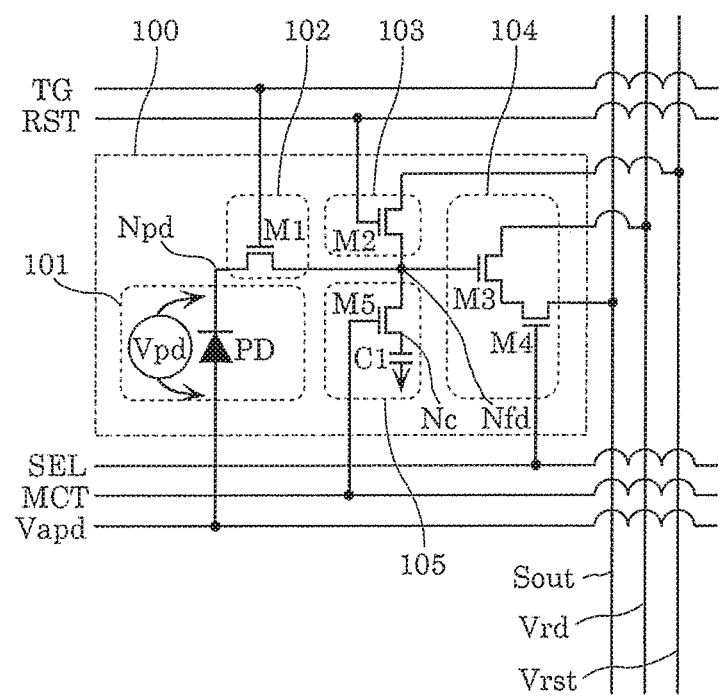
FIG. 1 is a circuit diagram showing an example of a configuration of a pixel circuit according to Embodiment 1.

Hereinafter, embodiments according to the present disclosure will be described in detail with reference to the drawings. It is to be noted that the same or corresponding elements in the diagrams are given the same reference numerals, and a redundant description thereof will be omitted. Also, electrically shorted portions (nodes) in the diagrams may be given the same reference numerals.

Embodiment 1

Configuration of Pixel Circuit

FIG. 1 is a circuit diagram showing an example of a configuration of pixel circuit 100. In pixel circuit 100, an avalanche photodiode is used as the photoelectric conversion element.

Pixel circuit 100 includes light receiver 101, transfer circuit 102, reset circuit 103, output circuit 104, and analog memory 105.

Light receiver 101 includes avalanche photodiode PD to which voltage Vpd is applied by bias terminal voltage Vapd and the initial voltage of node Npd.

Transfer circuit 102 includes transfer transistor M1 that transfers electric charges generated in node Npd through photoelectric conversion performed by avalanche photodiode PD to floating diffusion region Nfd (hereinafter, referred to simply as FD region) according to control signal TG.

Reset circuit 103 includes reset transistor M2 that selectively supplies reset voltage Vrst to all or any one of FD region Nfd, node Npd, and node Nc according to control signal RST so as to reset them.

Output circuit 104 includes: source follower transistor M3 that a receives readout voltage gird and amplifies electric current according to the amount of electric charges in FD region Nfd; and switch transistor M4 that outputs output signal Sout according to control signal SEL.

Analog memory 105 includes capacitor C1 that has node Nc that is brought into an electrically conductive state with FD region Nfd as a result of switch transistor M5 being controlled according to control signal MCT.

Here, as an example, it is assumed that all transistors used in pixel circuit 100 are N-type transistors, and each transistor is in a conductive state when the control signal applied to the gate of the transistor is H, and is in a non-conductive state when the control signal applied to the gate of the transistor is L.

In pixel circuit 100 configured as described above, node Npd and node Nfd are examples of the first node and the second node, respectively. Likewise, control signal TG, control signal RST, control signal SEL, and control signal MCT are examples of the first control signal, the second control signal, the third control signal, and the fourth control signal.

Although not shown in the diagram, as an example, the avalanche photodiode may perform photoelectric conversion by connecting the P region (anode) to a bias terminal, connecting the N region (cathode) to node Npd, and applying a negative voltage to bias terminal voltage Vapd. When photoelectric conversion is performed through the connections described above, electrons are generated in node Npd as electric charges. Accordingly, the voltage level of node Npd decreases from the initial voltage of node Npd, and an optical response signal is thereby obtained.

As another example, an avalanche photodiode may be used that performs photoelectric conversion by connecting the N region (cathode) to a bias terminal, connecting the P region (anode) to node Npd, and applying a positive voltage to bias terminal voltage Vapd. In this case, as a result of photoelectric conversion, positive holes are generated in node Npd as electric charges, and the initial voltage level of node Npd increases, and an optical response signal is thereby obtained.

The configuration of pixel circuit 100 is applicable irrespective of the device configuration of the avalanche photodiode.

Electric Charge Accumulation Mode Driving Method

Next, an electric charge accumulation mode of pixel circuit 100 shown in FIG. 1 will be described briefly with reference to FIGS. 2A and 2B.

Figure 2A:
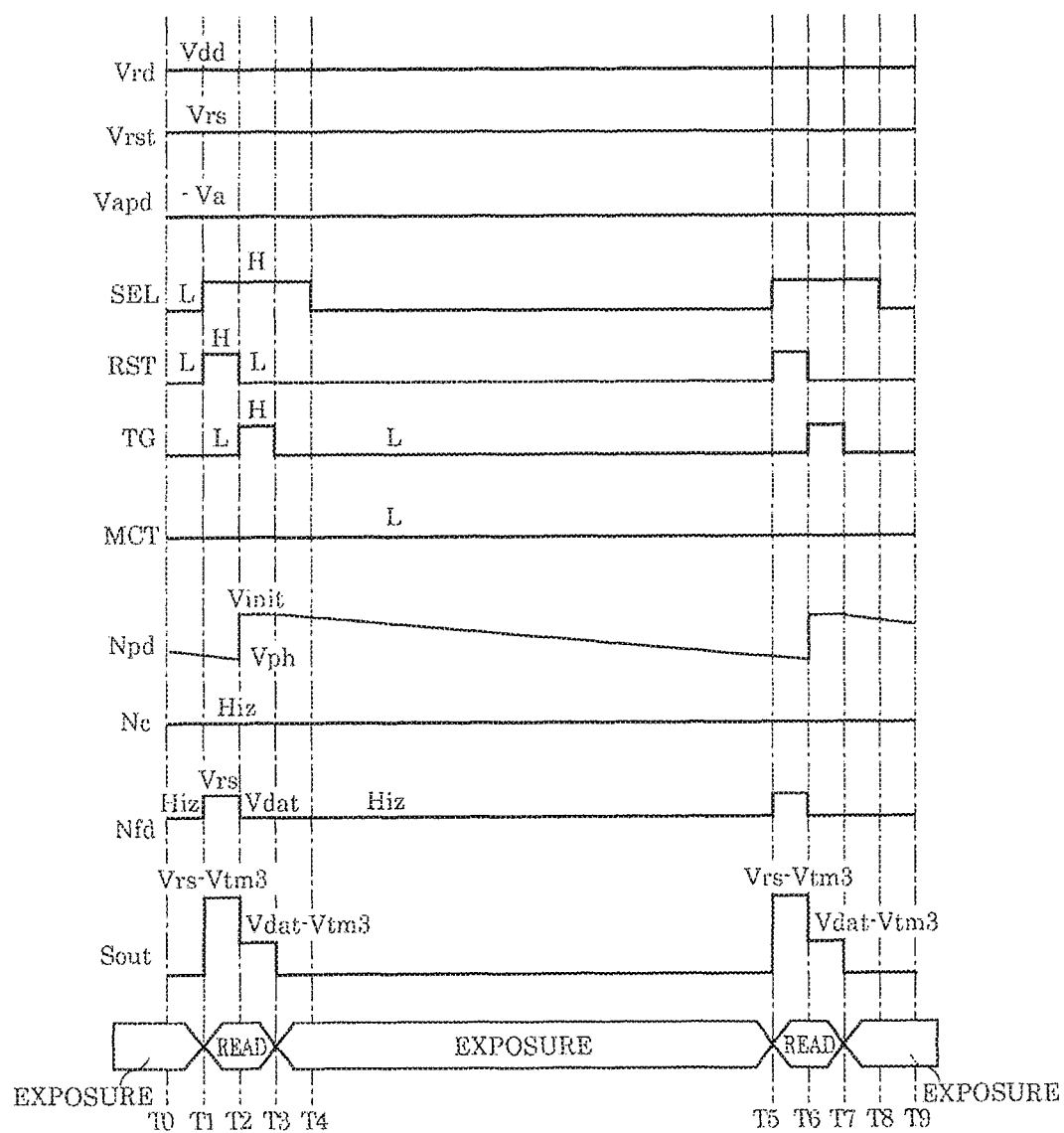
FIG. 2A is a timing chart showing an example of an electric charge accumulation mode according to Embodiment 1.

FIG. 2A is a timing chart showing an example of the electric charge accumulation mode.

Figure 2B:
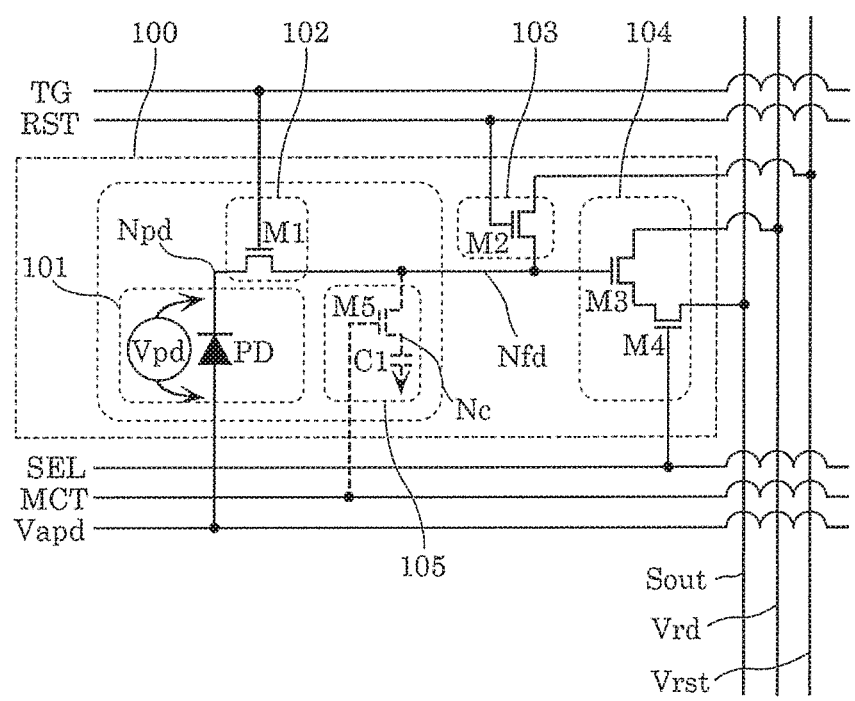
FIG. 2B is a circuit diagram showing an equivalent circuit during the electric charge accumulation mode of the pixel circuit according to Embodiment 1.

FIG. 2B is a circuit diagram showing an equivalent circuit during the electric charge accumulation mode of pixel circuit 100.

As an example, it is assumed that the following voltages are applied to pixel circuit 100: readout voltage Vrd=Vdd (where Vdd is power supply voltage); reset voltage Vrst=Vrs; and bias terminal voltage Vapd=−Va. Here, −Va is a negative voltage of 0 V or less. When −Va is applied, voltage Vpd is a voltage smaller than the breakdown voltage of the avalanche photodiode, and the electric charges generated through photoelectric conversion are not electron-multiplied.

Also, in order to electrically disconnect analog memory 105 from FD region Nfd, in the electric charge accumulation mode driving method, control signal MCT is consistently set to L. By doing so, node Nc is kept in floating state Hiz. In FIG. 2B, this state is indicated by a dotted line in analog memory 105.

[Time T0 (Initial State): Exposure]

At time T0, control signals SEL and RST are set to L, and FD region Nfd is thereby brought into floating state Hiz. Likewise, control signal TG is also set to L, and an exposure period starts. The electric charges (electrons) generated by the avalanche photodiode are accumulated in node Npd, and the potential of node Npd decreases.

[Time T1: Reset Voltage Readout]

At time T1, control signal RST is set to H, and FD region Nfd is thereby set to reset voltage Vrs. Likewise, control signal SEL is also set to H, and output signal Sout, ideally Vrs−Vtm3 (where Vtm3 is the threshold voltage of source follower transistor M3) is output by source follower transistor M3. [Time T2: Signal Voltage Readout]

At time T2, control signal RST is set to L, and control signal TG is set to H. Along with this change, the electric charges accumulated in node Npd as a result of avalanche photodiode PD performing photoelectric conversion are transferred from FD region Nfd. Due to transfer of electric charges, the voltage of node Npd is initialized from Vph to Vinit, and the voltage of FD region Nfd decreases from Vrs to Vdat. As a result, output signal Sout, ideally Vdata−Vtm3 is output.

Difference voltage (Vdat−Vtm3)−(Vrs−Vtm3)=(Vdat−Vrs) of the output signal is obtained as an optical detection signal generated as a result of photoelectric conversion.

[Time T4: Exposure]

At time T4, control signals SEL and RST are set to L, and FD region Nfd is brought into floating state Hiz. Likewise, control signal TG is also set to L, and an exposure period starts, and then the operation returns to the state of time T0.

Photon Counting Mode Driving Method: Pulse-Controlled Type

Next, a pulse-controlled type photon counting mode of pixel circuit 100 shown in FIG. 1 will be described briefly with reference to FIGS. 3A and 3B.

Figure 3A:
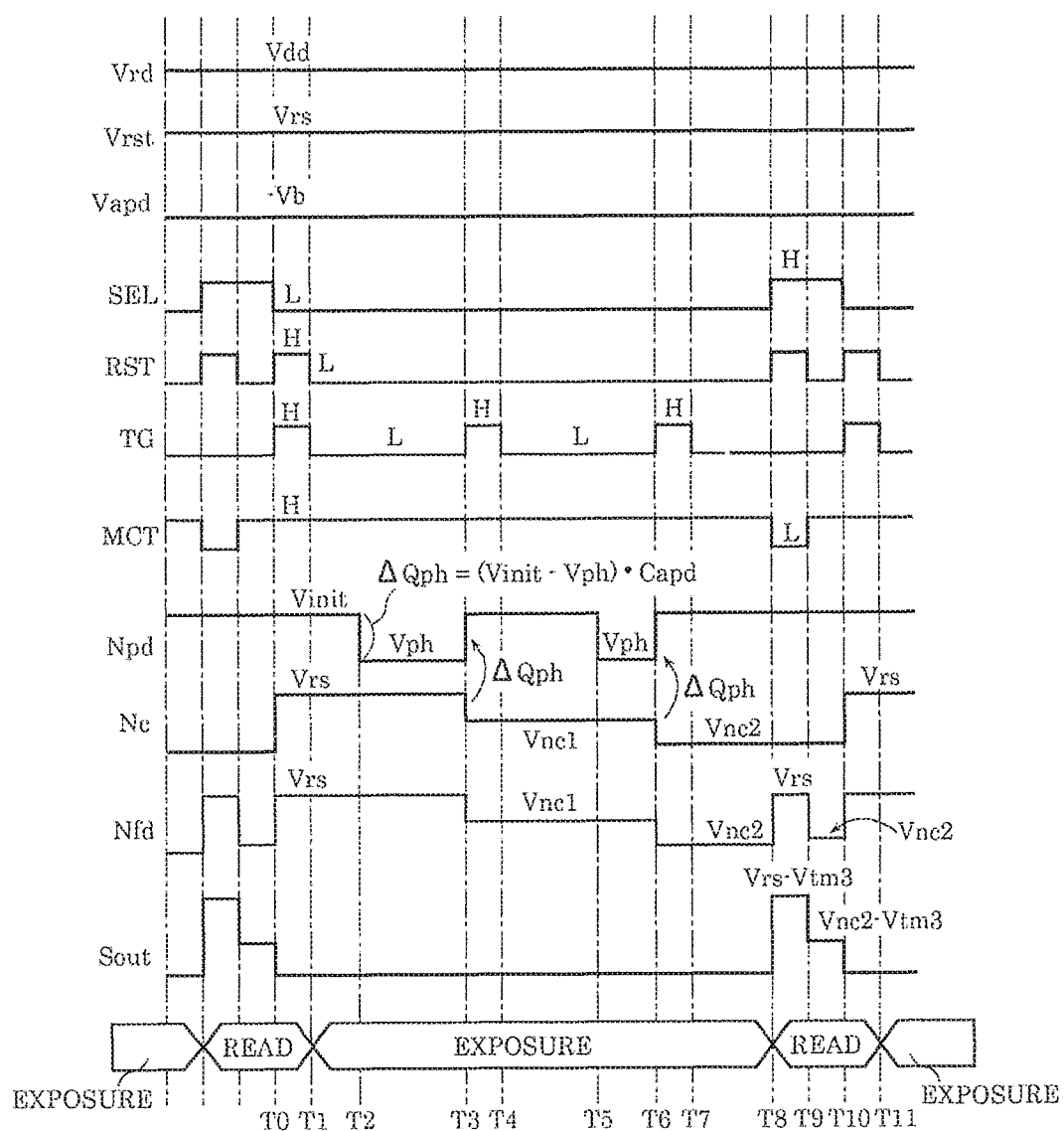
FIG. 3A is a timing chart showing an example of a pulse-controlled type photon counting mode according to Embodiment 1.

FIG. 3A is a timing chart showing an example of the pulse-controlled type photon counting mode.

Figure 3B:
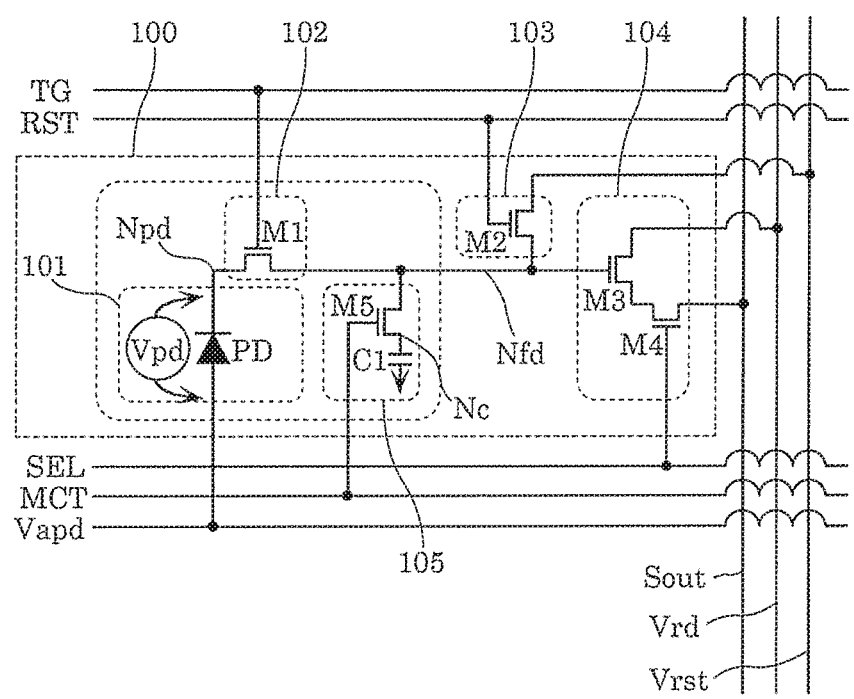
FIG. 3B is a circuit diagram showing an equivalent circuit during the pulse-controlled type photon counting mode of the pixel circuit according to Embodiment 1.

FIG. 3B is a circuit diagram showing an equivalent circuit during the pulse-controlled type photon counting mode of pixel circuit 100.

As an example, it is assumed that the following voltages are applied to pixel circuit 100: readout voltage Vrd=Vdd; reset voltage Vrst=Vrs; and bias terminal voltage Vapd=−Vb. Here, −Vb is a negative voltage that is lower than −Va. When −Vb is applied, voltage Vpd is a voltage larger than the breakdown voltage of the avalanche photodiode, and the electric charges generated through photoelectric conversion are electron-multiplied.

In the photon counting mode, analog memory 105 is electrically connected to (FIG. 3B) or disconnected from (FIG. 2B) FD region Nfd by pulse-controlling control signal MCT.

[Time T0 (Initial State): Reset After Readout]

At time T0, control signals RST, MCT, and TG are set to as a result of which FD region Nfd and node Nc are set to reset voltage Vrs, and node Npd is set to initial voltage Vinit (the initial voltage is determined based on the device configuration, and may be equivalent to reset voltage Vrs).

[Time T1: Exposure]

At time T1, control signals RST and TG are set to L, and the avalanche photodiode is thereby brought into an exposed state. At this time, node Nc has reset voltage Vrs, and node Npd has initial voltage Vinit.

[Time T2: First Photon Detection]

At time T2 it is assumed that photons are incident on the avalanche photodiode. The incident photons are subjected to photoelectric conversion, and then to electron-multiplication by the avalanche photodiode. As a result, electric charge $\Delta Qph=(Vinit-Vph)\cdot Capd$ is generated in node Npd. Here, Vph is the voltage of node Npd after electron-multiplication, and Capd is the capacitance of node Npd. Accordingly, the voltage of node Npd decreases from initial voltage Vinit to Vph.

[Time T3: First Photon Counting]

At time T3, control signal T0 is set to FT. Because control signal MCT has also been set to H, node Nc of analog memory 105 (capacitor C1) and node Npd of avalanche photodiode FD are brought into an electrically conductive state. As a result, electric charge ΔQph generated in node Npd at time T2 is directly supplemented by the electric charges accumulated in advance in node Nc of capacitor C1, and the transfer of electric charges ends automatically upon completion of the supplement of the electric charge.

Upon completion of the transfer of electric charges, node Npd is set from Vph to initial voltage Vinit, and node Nc is set from reset voltage Vrs to voltage Vnc1 (=VRS·(Vinit−Vph)·Capd/(capacitance of C1)).

As described above, the electric charges generated by avalanche photodiode FD in response to a photon incident event in avalanche photodiode FD in synchronization with control signal TG are supplemented directly from analog memory 105, and the potential of node Nc of analog memory 105 varies accordingly. Accordingly, the photon incident event can be converted to a voltage change of node Nc of analog memory 105. This operation be referred to as "pulse-controlled type photon counting mode".

[Time T4: Exposure]

At time T4, control signal TG is set to L, as a result of which node Nc of analog memory 105 has voltage Vnc1, then, an exposure period starts again.

[Time T5: Second Photon Detection]

At time T5, photons are incident on the avalanche photodiode. As in time T2, electron-multiplied electric charge ΔQph is generated in node Npd by the avalanche photodiode, and node Npd has voltage Vph.

[Time T6: Second Photon Counting]

At time T6, control signal TG is set to H, as a result of which electric charge ΔQph accumulated in node Npd of the avalanche photodiode is directly supplemented from node Nc of analog memory 105 (capacitor C1). Upon completion of the supplement of the electric charge, the transfer of electric charges ends automatically.

Upon completion of the transfer of electric charges, node Npd is set from Vph to initial voltage Vinit, and node Nc is set from voltage Vnc1, which was set at the time of first photon counting, to Vnc2 (=Vnc1−(Vinit−Vph)·Capd/(capacitance of C1)), as with the operation performed in time T3.

With the configuration described above, each time control signal T0 is transitioned to H, if there is a photon incident event, the voltage of node Nc of analog memory 105 decreases by ΔVcount=(Vinit−Vph)·Capd/(capacitance of C1).

By repeating the pulse-control of control signal TG, the photon counting mode is repeated, and the maximum value of the number of photon counting operations can be adjusted by the number of pulses of control signal TG during the exposure period. Accordingly, it is also possible to adjust the analog gradation of output signal Sout.

[Time T7: Exposure]

At time T7, control signal TG is set to L, and node Nc of analog memory 105 thereby has voltage Vnc2, then, an exposure period starts again, as with the operation performed in time T4.

In this way, the pulse-controlled type photon counting mode is carried out by repeating exposure [Time T1], photon detection [Time T2], a direct electric charge supplement operation according to control signal TG and a voltage change of node Nc of analog memory 105 resulting from the direct electric charge supplement operation [Time T3], and exposure [Time T4].

[Time TB: Reset Voltage Readout]

At time T8, control signal MCT is set to L, and node Nc of analog memory 105 (capacitor C1) thereby has voltage Vnc2. PD region Nfd is set to reset voltage Vrs by setting control signal RST to H. Because control signal SEL is set to H, ideally, Vrs−Vtm3 is output by source follower transistor M3.

[Time T9: Signal Voltage Readout]

At time T9, control signal RST is set to L, and control signal MCT is set to H, as a result of which FD region Nfd is set to Vnc2 that is the same potential as node Nc of analog memory 105 (capacitor C1). Because control signal SEL has been set to H, Vnc2−Vtm3 is output by source follower transistor M3.

With (Vrs−Vtm3)−(Vnc2−Vtm3)=(Vrs−Vnc2) that is the difference voltage between the reset voltage and the signal voltage, the number of photon incident events can be detected.

[Time T10: Reset After Readout]

At time T10, control signals RST, MCT, and TG are set to H, as a result of which FD region Nfd and node Nc are set to reset voltage Vrs, and node Npd is set to initial voltage Vinit. The operation returns to the state of time T0.

Another Photon Counting Mode Driving Method: Event-Driven Type

Next, an event-driven type photon counting mode of pixel circuit 100 shown in FIG. 1 will be described briefly with reference to FIG. 4A. The event-driven type photon counting mode is another example of a photon counting mode.

Figure 4A:
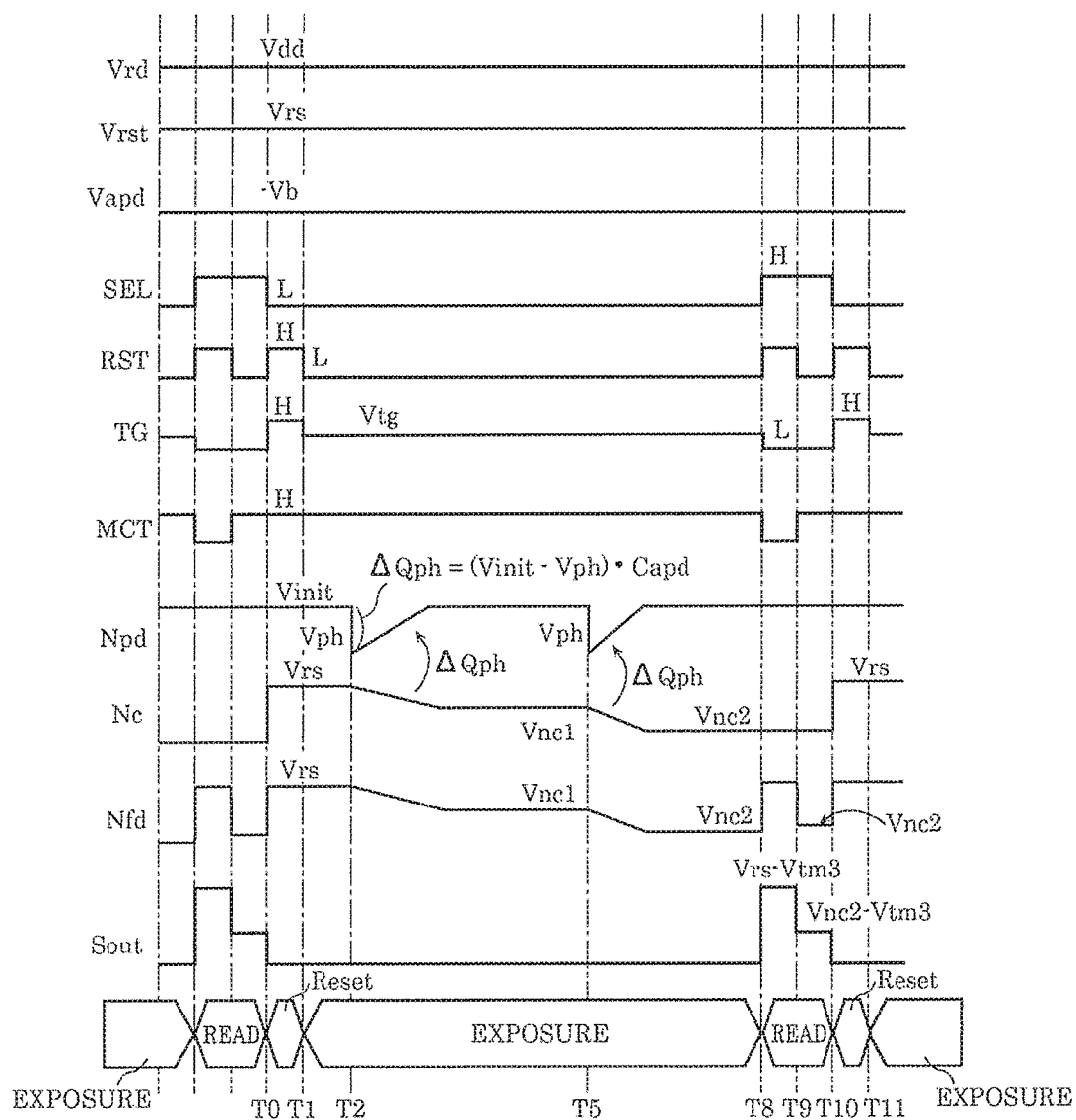
FIG. 4A is a timing chart showing an example of an event-driven type photon counting mode according to Embodiment 1.

FIG. 4A is a timing chart showing an example of the event-driven type photon counting mode. In the event-driven type photon counting mode, in response to detection of a photon incident event, a direct electric charge supplement performed by node Nc of analog memory 105 and a voltage change take place, and a photon counting operation is thereby performed.

A difference from FIG. 3A is that control signal TG is set to constant voltage Vtg (voltage Vtg may be have the same potential as the voltage when it is set to H) during the exposure period. Accordingly, the operations performed during the exposure period from [Time T2] to [Time T8] are different from those performed in the pulse-controlled type photon counting mode shown in FIG. 3A, and thus differences will be described briefly.

[Time T2: Exposure, First Photon Detection, and Photon Counting]

It is assumed, that at time T2, photons are incident on the avalanche photodiode.

The incident photons are subjected to photoelectric conversion by the avalanche photodiode, and thereafter electron-multiplied electric charges are accumulated in node Npd, and the voltage decreases to Vph. As a result of the voltage of node Npd decreasing by several hundreds of millivolts, voltage Vpd decreases to be less than or equal to the breakdown voltage, and the electron-multiplication ends.

On the other hand, due to generated electric charge ΔQph, the voltage of node Npd starts decreasing from initial voltage Vinit. In response thereto, transfer transistor M1 starts flowing a sub-threshold current, and the voltage of FD region Nfd starts decreasing. Likewise, when the voltage of FD region Nfd starts decreasing, switch transistor M5 starts flowing a sub-threshold current, and the voltage of node Nc of analog memory 105 starts decreasing.

When the voltage of node Npd reaches initial voltage Vinit, and the voltage of analog memory 105 decreases by ΔVcount=(Vinit−Vph)·Capd/(capacitance of C1), the electric charge supplement ends, and the voltage of node Nc is set to Vnc1=(Vrs−ΔVcount), and the operation returns to the exposure period again.

A series of operations has been described above in which when a photon incident event takes place, electric charge ΔQph generated by avalanche photodiode PD is supplemented directly by the electric charges in node Nc of analog memory 105, and ideally the voltage of node Nc of analog memory 105 is decreased by ΔVcount, thereafter the operation returns to the exposure period again. The series of operations will be referred to as "event-driven type photon counting mode".

[Time T5: Exposure, Second Photon Detection, and Photon Counting]

As in time T2, when a photon incident event takes place, electric charge ΔQph generated by avalanche photodiode PD is directly supplemented by the electric charges in node Nc of analog memory 105, and ideally the voltage of node Nc of analog memory 105 is decreased by ΔVcount=(Vinit−Vph)·Capd/(capacitance of C1), and the voltage of node Nc is set to Vnc2=(Vnc1−ΔVcount), thereafter the operation returns to the exposure period again.

[Time T8: Reset Voltage Readout Period]

From time T8, the same operations as those shown in FIG. 3A are performed. Accordingly, a description thereof is omitted here.

Application Example of Event-Driven Type Photon Counting Mode

Figure 4B:
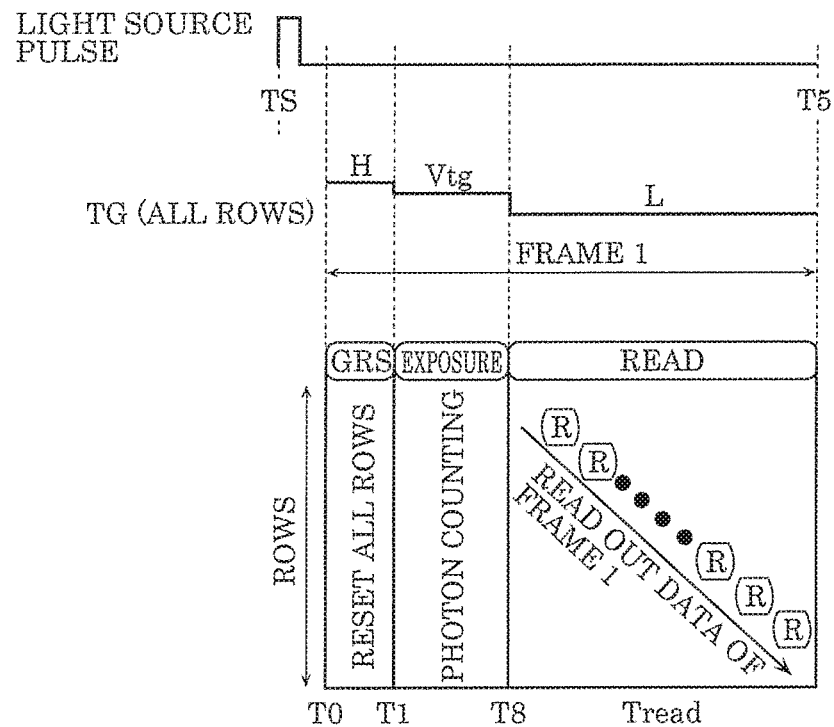
FIG. 4B is a timing chart showing an application example of the event-driven type photon counting mode according to Embodiment 1.

FIG. 4B is a timing chart showing an application example of the event-driven type photon counting mode shown in FIG. 4A, and shows an example of operations performed in pixel circuits 100 that are arranged in a plurality of rows. Time T0 to T8 shown in FIG. 4B are the same as those shown in FIG. 4A, and the same operations as described above are performed in pixel circuits 100 in all rows. Also, time Tread corresponds to Read period shown in FIG. 4A, and data is read out for each row.

Operations will be described briefly with reference to FIG. 4B.

At time TS, a light source emits light to a target object.

At time T0, pixel circuits 100 in all rows are reset.

At time T1 to time T8, the event-driven type photon counting mode is performed in pixel circuits 100 in all rows. It is desirable that the light source pulse is a repetition pulse or a rectangular wave activated for a fixed period of time. The number of photon incident events increases as the distance to the target object is shorter. For this reason, the voltage decreases according to ΔVcount that is the amount of voltage change of analog memory 105 for each photon incident event. After time T8, data is read out for each row. Based on the voltage level of output signal Sout, the distance to the target object can be measured.

As described above, in the event-driven type photon counting mode, each time a photon incident event takes place in the avalanche photodiode, the voltage of analog memory 105 varies. Accordingly, the photon counting operation can be performed without the need to drive control signal TG, and the number of photon incident events can be converted to the voltage level of node Nc of analog memory 105 and detected.

Pixel Circuit Designed Specifically for Photon Counting Mode

Figure 5:
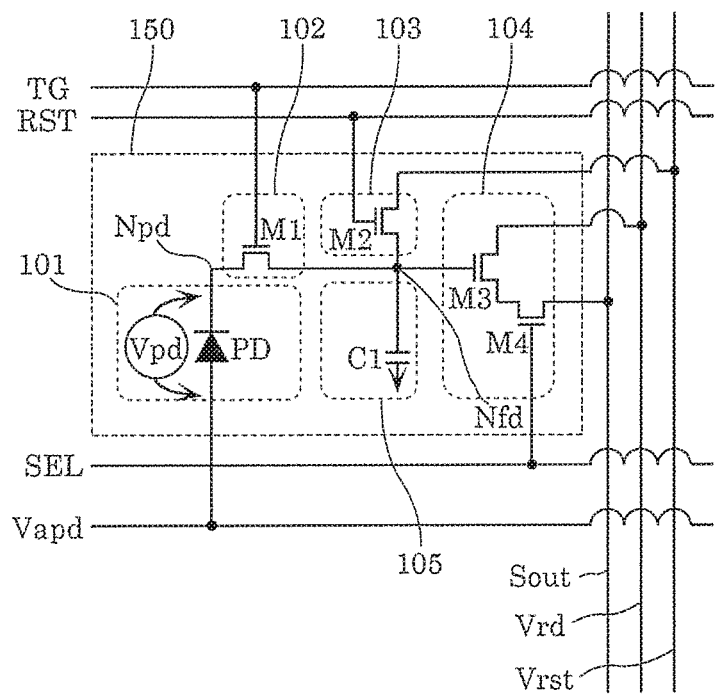
FIG. 5 is a circuit diagram showing an example of a configuration of a pixel circuit that is designed specifically for photon counting mode according to Embodiment 1.

FIG. 5 is a circuit diagram showing an example of a configuration of pixel circuit 150 that is designed specifically for photon counting mode.

Pixel circuit 150 may be designed specifically for photon counting mode so as to perform only the pulse-controlled type photon counting or the event-driven type photon counting, and not perform the electric charge accumulation mode. In this case, based on the description given above, the minimum elements required to perform photon counting are avalanche photodiode PD, transfer transistor M1, and capacitor C1 that is included in analog memory 105.

In the case where the electric charge accumulation mode is not performed, capacitor C1 may be constantly connected to FD region Nfd. Accordingly, pixel circuit 150 designed specifically for photon counting mode is configured by omitting switch transistor M5 from pixel circuit 100.

Multimode Driving Method

Next, a multimode of pixel circuit 100 shown in FIG. 1 will be described briefly with reference to FIG. 6.

Figure 6:
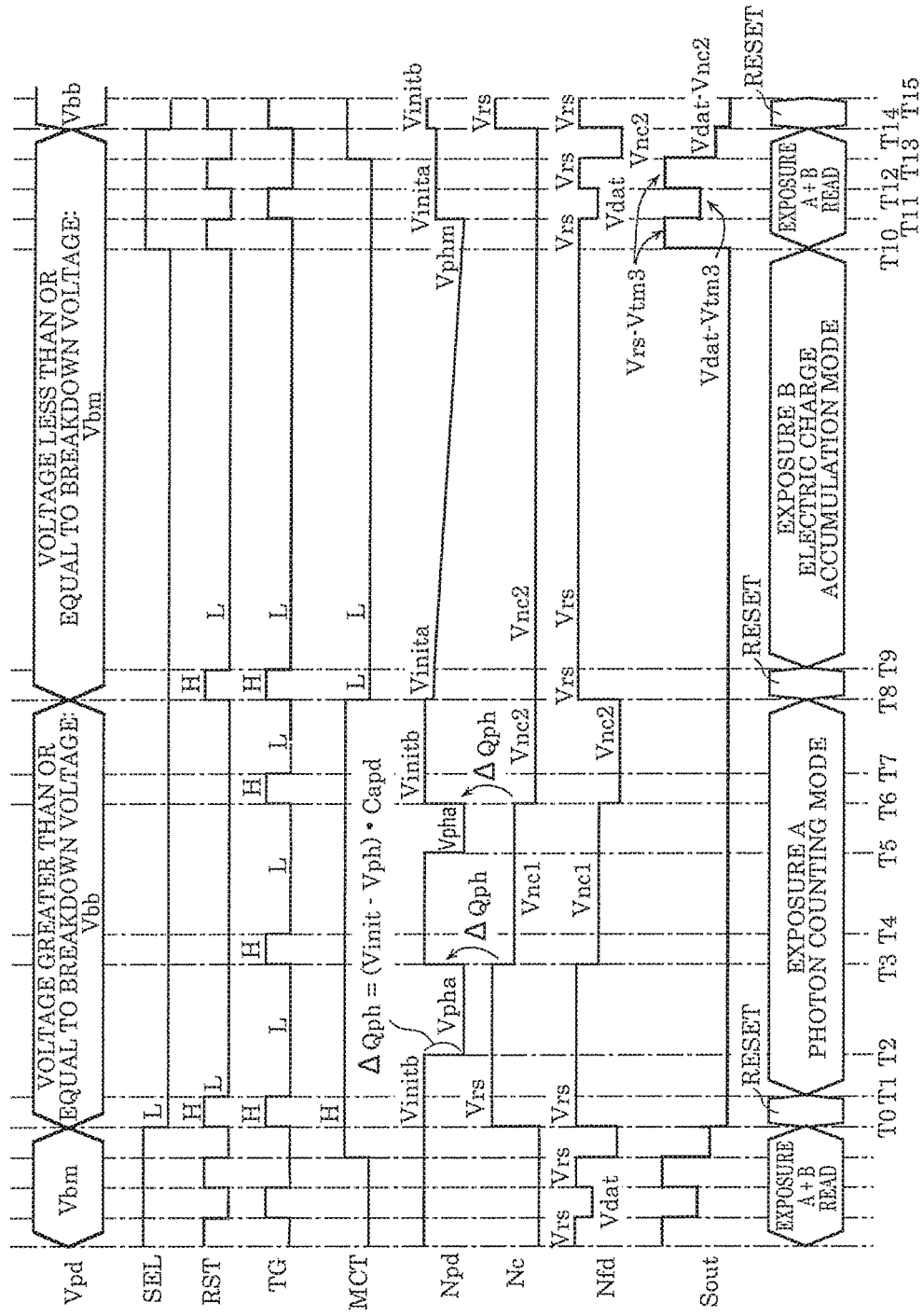
FIG. 6 is a timing chart showing an example of multimode according to Embodiment 1.

FIG. 6 is a timing charge showing an example of the multimode. The multimode is different from the electric charge accumulation mode shown in FIG. 2A and the photon counting mode shown in FIG. 3A in that instead of independently reading out data acquired in each mode, a photon counting mode is performed, and thereafter an electric charge accumulation mode is performed, and then the data accumulated by the photon counting and the data accumulated by the electric charge accumulation are continuously read out.

The operations described above will be summarized as follows.

[Time T0: Reset]

The avalanche photodiode included in light receiver 101, and analog memory 105 are reset.

[Time T1 to T8: Pulse-Controlled Type Photon Counting Mode]

The pulse-controlled type photon counting mode is performed. A voltage greater than or equal to the breakdown voltage is applied to the avalanche photodiode, and data after the photon counting is accumulated in analog memory 105.

[Time T8: Reset]

The avalanche photodiode is reset.

[Time T0 to T10: Electric Charge Accumulation Mode]

The electric charge accumulation mode is performed. A voltage less than or equal to the breakdown voltage is applied to the avalanche photodiode, and data obtained in the electric charge accumulation mode is accumulated in node Npd.

[Time T10 to T12: First Readout Operation]

The first readout operation is performed. Transfer transistor M1 is set in a conductive state, and the data obtained in the electric charge accumulation mode is read out from node Npd as output signal Sout (electric charge accumulation mode).

[Time T12 to Time T14: Second Readout Operation]

The second readout operation is performed. Switch transistor M5 is set in a conductive state, and the data obtained in the photon counting mode is read out from analog memory 105 as output signal Sout (photon counting mode).

[Time T14: Reset After Readout]

The avalanche photodiode and analog memory 105 are reset, and the operation returns to the state of time T0.

According to the multimode driving method described above, the electric charge accumulation mode is performed after the photon counting mode with which data is accumulated in analog memory 105, and the data obtained in the two modes are continuously read out. With this configuration, the data in the two modes can be easily computed while suppressing the influence of circuit noise.

Hereinafter, a specific example of data computation, and a circuit used to perform data computation will be described.

Figure 7:
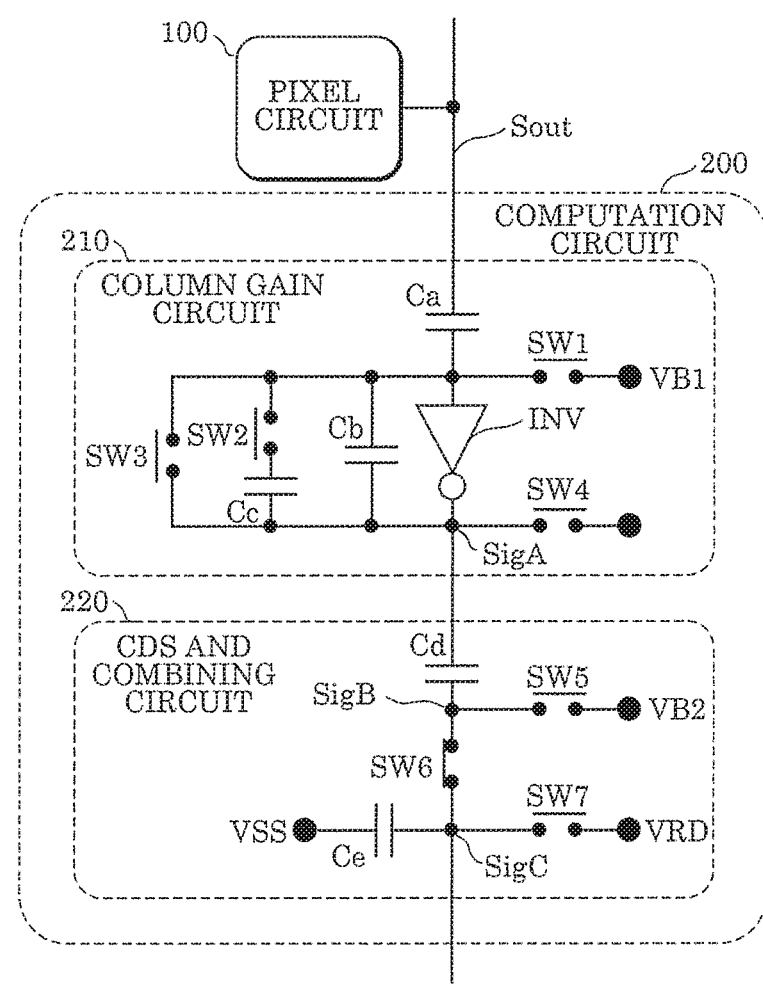
FIG. 7 is a circuit diagram showing an example of a signal processing circuit applied to the multimode according to Embodiment 1.

FIG. 7 is a circuit diagram showing an example of computation circuit 200 for computing output signal Sout that is read out in the electric charge accumulation mode and the pulse-controlled type photon counting mode during the multimode shown in FIG. 6.

Computation circuit 200 includes: column gain circuit 210, and CDS (correlated double sampling) and combining circuit 220.

Column gain circuit 210 includes: capacitor Ca that is connected to output signal Sout; inverter INV; capacitors Cb and Cc that are connected in parallel to inverter INV; and switches SW1 to SW4.

Signal SigA that is output from column gain circuit 210 can be represented by SigA=(Ca/Cg)·(the amount of voltage change of Sout). Here, Cg is switched to either the capacitance of Cb or the combined capacitance of Cb and Cc according to switch SW2 while switch SW3 is in a non-conductive state. That is, the gain of column gain circuit 210 can be switched between at least two stages.

CDS and combining circuit 220 sets SW5 in a conductive state, and fixes signal SigB to constant voltage VB2 when reading out a reset voltage with respect to signal SigA from column gain circuit 210. Also, when reading out signal SigA in each of the electric charge accumulation mode and the photon counting mode, CDS and combining circuit 220 sets SW5 in a non-conductive state, and SW6 in a conductive state so as to combine the signal voltages in the two modes. Then, the difference voltage between the reset voltage and the combined signal voltage can be accumulated in capacitor Ce.

As described above, computation circuit 200 calculates a weighted sum of signals SigA in the electric charge accumulation Triode and the photon counting mode.

Signal processing circuit 200 configured as described above is driven in the following manner.

SW7 is set in a conductive state so as to fix signal SigC to constant voltage VRD, and SW7 is set in a non-conductive state.

Output signal Sout in the electric charge accumulation mode is read out, and signal electric charges are accumulated in capacitor Ce.

Output signal Sout in the photon counting mode is read out, and signal electric charges are additionally accumulated in capacitor Ce.

Figure 8A:
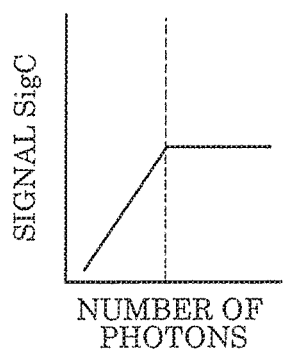
FIG. 8A is a graph showing an example of a relationship between the number of photons and a signal according to Embodiment 1.
Figure 8B:
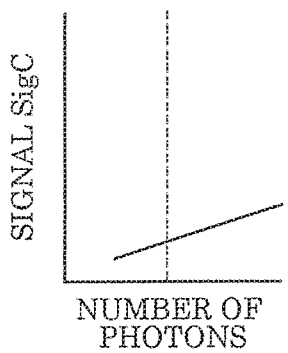
FIG. 8B is a graph showing an example of a relationship between the number of photons and the signal according to Embodiment 1.
Figure 8C:
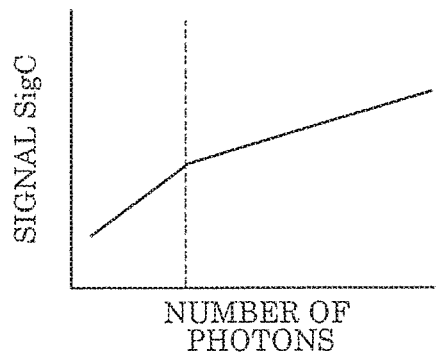
FIG. 8C is a graph showing an example of a relationship between the number of photons and the signal according to Embodiment 1.

FIGS. 8A, 8B, and 8C are graphs each showing an example of relationship between the number of photons and signal SigC. FIG. 8A shows an example obtained, in the photon counting mode, FIG. 8B shows an example obtained in the electric charge accumulation mode. FIG. 8C shows an example in which output signal Sout in the electric charge accumulation mode and output signal Sout in the photon counting mode are combined.

In FIG. 8C, the slope of signal SigC in the photon counting mode (on the left side of the dotted line) and the slope of signal SigC in the electric charge accumulation mode (on the right side of the dotted line) can be independently adjusted through gain adjustment by column gain circuit 210.

As described above, exposure is performed continuously by switching between two modes so as to accumulate the signal electric charges in the first mode in analog memory 105, and accumulate the signal electric charges in the second mode in the avalanche photodiode. Data is also continuously read out by switching between two modes. For example, the signal electric charges in the second mode are read out by the output circuit, and then continuously, the signal electric charges in the first mode are read out by the output circuit.

When reading out signal electric charges in each mode, the reset voltage may be read out together with the signal electric charges before or after the signal electric charges are read out.

Also, the readout order may be set such that the signal electric charges in the first mode are read out first, and thereafter the signal electric charges in the second mode are read out.

As described above, by accumulating signal electric charges in avalanche photodiode PD and analog memory 105 in pixel circuit 100 in each mode, and continuously reading out the signals in the two modes, the data can be computed without the use of a frame memory.

The computation of data can be carried out within the solid-state image-capturing device such as in the column circuit, but may be carried out by providing a line buffer outside the solid-state image-capturing device.

Hereinafter, variations of pixel circuit 100 will be described.

Clamp Function of Avalanche Photodiode

Figure 9A:
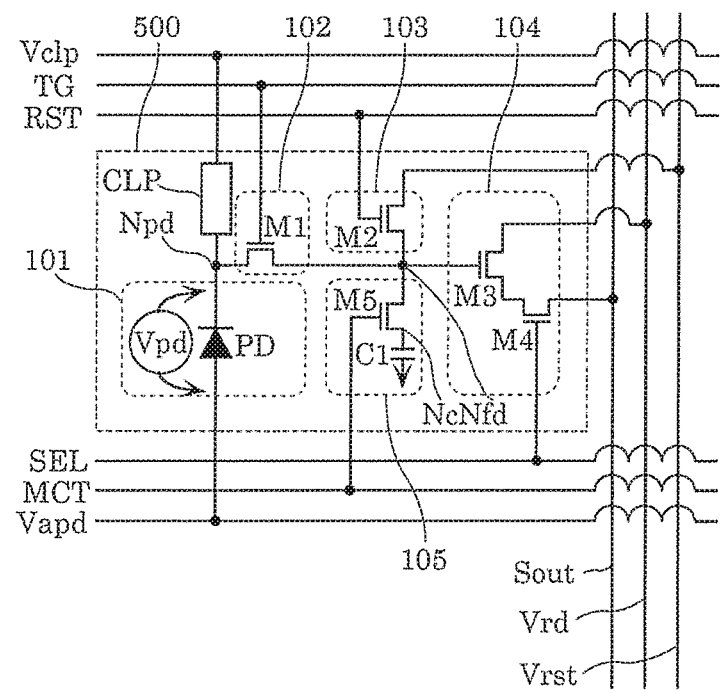
FIG. 9A is a circuit diagram showing an example of a configuration of a pixel circuit according to a variation of Embodiment 1.

Pixel circuit 500 shown in FIG. 9A is a variation of pixel circuit 100.

Pixel circuit 500 includes, in addition to the configuration of pixel circuit 100, clamp circuit CLP that is capable of applying clamp voltage Vclp at node Npd of avalanche photodiode PD.

During the photon counting mode of the avalanche photodiode, node Nfd decreases from the initial voltage to Vph. In the case of pixel circuit 100, the voltage of node Nfd is clamped by a diffusion diode of transfer transistor M1. In pixel circuit 500, the voltage level of voltage Vph can be set by providing clamp circuit CLP. Clamp circuit CLP may be provided with a diode or a bipolar transistor as a device, or may be provided with a diode as an electronic circuit.

Because clamp voltage Vclp can be set to any value, ΔVcount=(Vinit−Vph)·Capd/(capacitance of C1) that is the voltage variation of analog memory 105 at the time of a photon incident event can be set to ΔVcount=(Vinit−Vclp)·Capd/(capacitance of C1). Accordingly, it is possible to change analog gradation, and optimal imaging can be performed.

Analog Memory Including Plurality of Capacitors

Figure 9B:
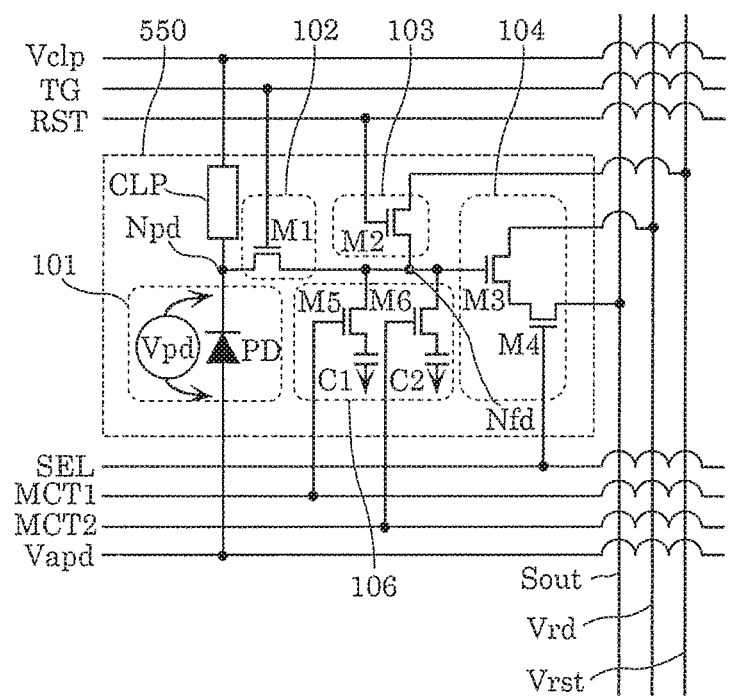
FIG. 9B is a circuit diagram showing an example of a configuration of a pixel circuit according to a variation of Embodiment 1.

Pixel circuit 550 shown in FIG. 9B is a variation of pixel circuit 100.

Pixel circuit 550 is different from pixel circuit 100 in that analog memory 106 includes capacitors C1 and C2, and switching transistors M5 and M6.

With this configuration, the voltage variation of analog memory 106 at the time of a photon incident event can be set to ΔVcount=(Vinit−Vph) Capd Csum. Here, Csum is any one of the capacitance of C1, the capacitance of C2, and the combined capacitance of C1 and C2 according to control signals MCT1 and MCT2. As a result, it is possible to change the dynamic range for photon counting, and therefore imaging suitable for the environment can be performed. That is, the analog gradation can be changed, and optimal imaging can be performed.

Switching of Bias Voltage of Avalanche Photodiode

Next, is a description of a circuit that switches the bias voltage of the avalanche photodiode so as to perform the electric charge accumulation mode (FIG. 2A) and the photon counting mode (FIGS. 3A and 4A).

Figure 10A:
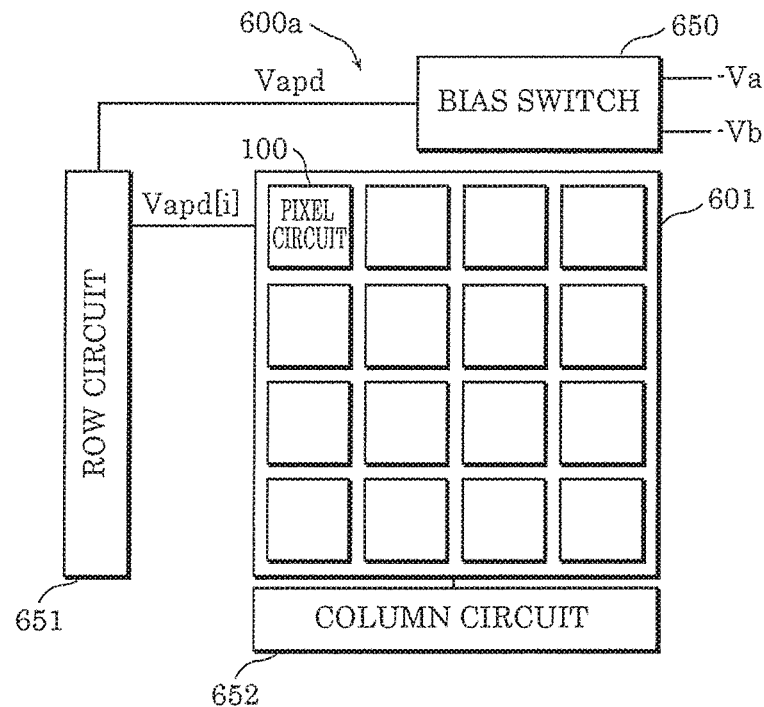
FIG. 10A is a block diagram showing an example of a configuration of a pixel array and a bias switch according to Embodiment 1.

FIG. 10A is a block diagram showing an example of a functional configuration of solid-state image-capturing device 600a. Solid-state image-capturing device 600a includes pixel array 601, row circuit 651, column circuit 652, and bias switch 650. Pixel array 601 is formed by a plurality of pixel circuits 100 that are arranged in rows and columns. Row circuit 651 supplies various types of control signals to pixel circuits 100 in each row. Column circuit 652 processes output signals from pixel circuits 100 in each column. Bias switch 650 selectively outputs one of voltages −Va and −Vb as bias terminal voltage Vapd.

In solid-state image-capturing device 600a, one of voltages −Va and −Vb selected by bias switch 650 is supplied as bias terminal voltage Vapd to the avalanche photodiodes of pixel circuits 100 in each row via row circuit 651. One of voltages −Va and −Vb is for use in the electric charge accumulation mode in which the difference with respect to initial voltage Vinit of node Npd is smaller than the breakdown voltage of the avalanche photodiode, and the other is for use in the photon counting mode in which the difference with respect to initial voltage Vinit of node Npd is greater than the breakdown voltage of the avalanche photodiode.

Figure 10B:
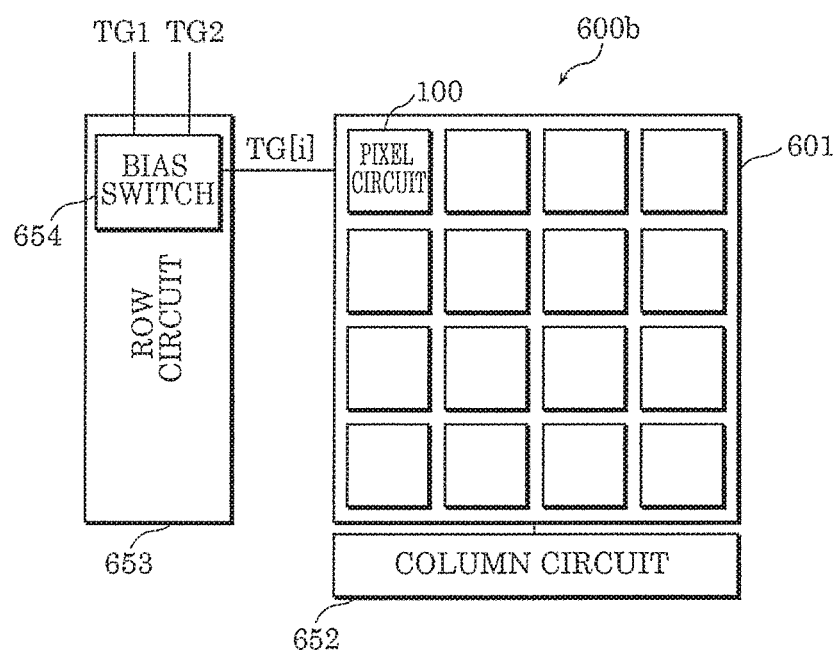
FIG. 10B is a block diagram showing an example of a configuration of a pixel array and a bias switch according to Embodiment 1.

FIG. 10B is a block diagram showing an example of a functional configuration of solid state image-capturing device 600b. Solid-state image-capturing device 600b includes pixel array 601, row circuit 653, and column circuit 652. Pixel array 601 is formed by a plurality of pixel circuits 100 that are arranged in rows and columns. Row circuit 653 includes bias switch 654, and supplies various types of control signals to pixel circuits 100 in each row. Column circuit 652 processes output signals from pixel circuits 100 in each column.

In solid-state image-capturing device 600b, bias switch 654 switches the voltage of control signal TG [i] of each row to either voltage TG1 or TG2, so as to set initial voltage Vinit of node Npd to the voltage corresponding to voltage TG1 or TG2. One of voltages TG1 and TG2 is for use in the electric charge accumulation mode for setting initial voltage Vinit whose difference with respect to voltage Vapd is smaller than the breakdown voltage of the avalanche photodiode, and the other is for use in the photon counting mode for setting initial voltage Vinit whose difference with respect to voltage Vapd is greater than the breakdown voltage of the avalanche photodiode.

Initial voltage Vinit of node Npd may be switched by selectively using two types of reset voltages Vrst, instead of selectively using the two types of voltages of control signal TG.

Advantageous Effect

The pixel circuit described above enables shared use of the output circuit between the electric charge accumulation mode and the photon counting mode. With this configuration, the number of structural elements that constitute each pixel circuit can be reduced, as a result of which it is possible to develop a solid-state image-capturing device with a reduced pixel circuit area and a large number of pixels.

Also, because the electric charges generated by the avalanche photodiode are supplemented directly to the avalanche photodiode from the analog memory in which the electric charges have been accumulated in advance, it is possible to control a very small amount of electric charges without adding an additional control transistor for discharging, as a result of which it is possible to develop a solid-state image capturing device with a reduced pixel circuit area and a large number of pixels. By repeating the above-described operations, the number of photon incident events is converted to the voltage of the analog memory, and it is thereby possible to perform photon counting.

Also, a diode, a bipolar transistor, or a clamp circuit such as a resistor that can clamp at a desired bias may be provided at one end of the avalanche photodiode. With this configuration, when the avalanche photodiode performs electron-multiplication, the voltage at the one end of the avalanche photodiode can be set to the desired bias, and it is possible to control analog gradation at the time of photon counting.

Also, with the method for driving the transistor provided between the avalanche photodiode and the analog memory, it is possible to perform the event-driven type photon counting mode in which photon counting is performed in response to a photon incident event, and the pulse-controlled type photon counting mode in which photon counting is performed in synchronization with the control signal that is activated at a regular interval.

Also, because a plurality of analog memories are included, it is possible to change the dynamic range for photon counting, and therefore imaging suitable for the environment can be performed.

Embodiment 2

In Embodiment 2, a description will be given of a solid-state image-capturing device that includes the pixel circuit according to Embodiment 1.

Figure 11:
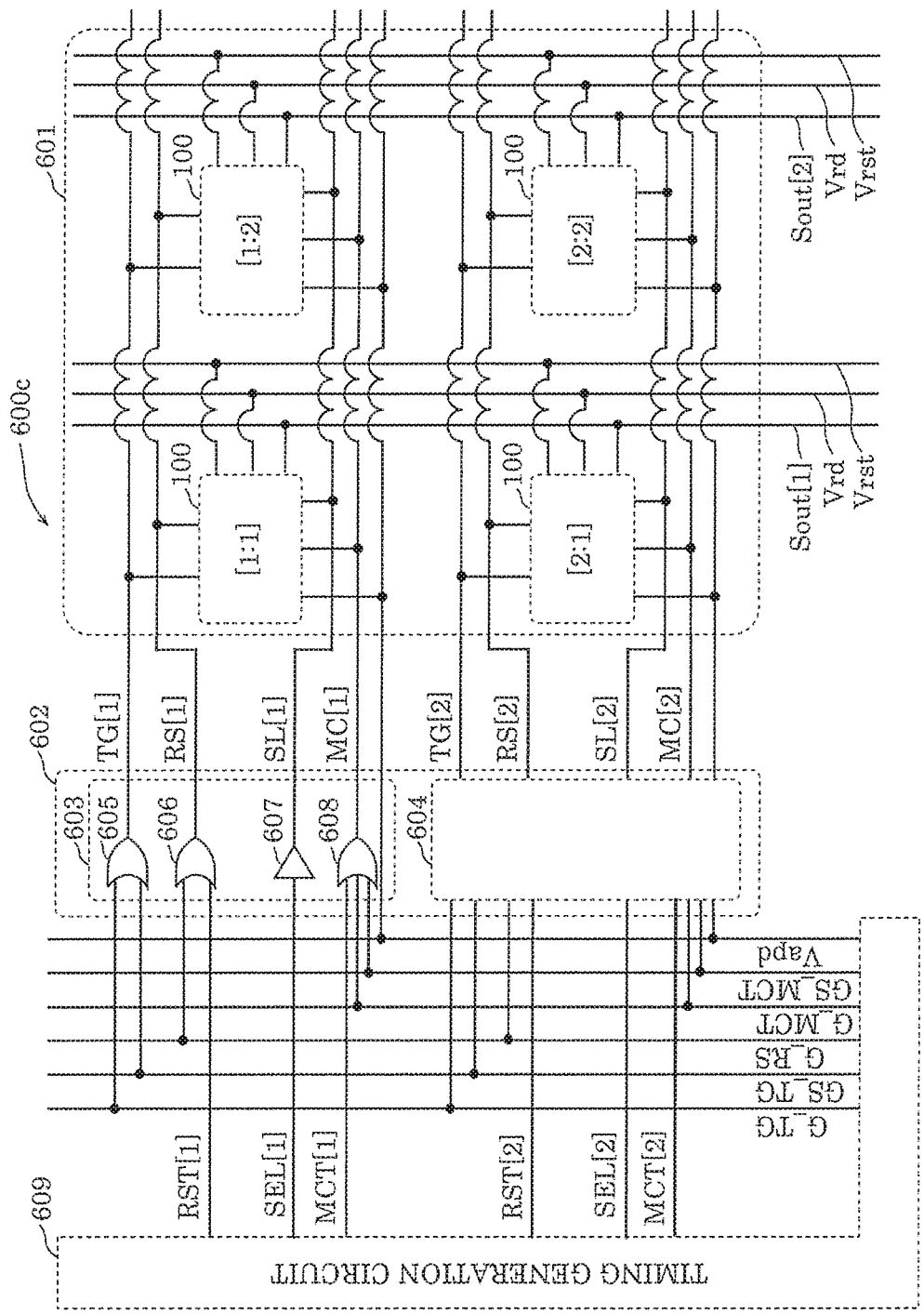
FIG. 11 is a block diagram showing a configuration of a pixel array and a buffer according to Embodiment 2.

Control Signal and Buffer Circuit Configuration for Global Electronic Shutter Driving FIG. 11 is a block diagram showing an example of a configuration of a relevant part of solid-state image-capturing device 600c that includes a plurality of pixel circuits. As the pixel circuits, for example, pixel circuits 100 as shown in FIG. 1 can be used.

Solid-state image-capturing device 600c includes: pixel array 601 that includes a plurality of pixel circuits 100 that are arranged in rows and columns; buffer circuit 602; and timing generation circuit 609. FIG. 11 shows, as an example, a configuration of two rows and two columns in solid-state image-capturing device 600c. Hereinafter, the structural elements in the i-th row will be indicated by a subscript [i], the structural elements in the j-th column will be indicated by a subscript [j], and the structural elements in the i-th row of the j-th column will be indicated by a subscript [i:j].

Timing generation circuit 609 generates local control signals RST [i], MCT [i], and SEL [i] whose timings are different for each row, global control signals G_TG, GS_TG, G_RS, G_MCT, and GS_MCT whose timings are the same for a plurality of rows (or it may be all rows), and bias terminal voltage Vapd, and supplies these signals to buffer circuit 602.

Buffer circuit 602 includes subbuffer circuits 603 and 604 that have the same configuration and are provided in respective rows.

Subbuffer circuit 603 generates control signals TG [1], RS [1], SL [1] and MCT [1] from local control signals RST [1], MCT [1] and SEL [1], and global control signals G_TG, GS_TG, G_RS, G_MCT and GS_MCT, and supplies these signals to pixel circuits 100 in the first row. Also, subbuffer circuit 603 distributes bias terminal voltage Vapd to pixel circuits 100 in the first row.

Control signal TG [1] is a logical OR signal between global control signals G_TG and GS_TG generated by OR circuit 605, and controls transfer transistor M1.

Control signal RS [1] is a logical OR signal between global control signal G_RS generated by OR circuit 606 and local control signal RST [1], and controls reset transistor M2.

Control signal SL [1] is local control signal SEL [1] transmitted via buffer element 607, and controls switch transistor M4.

Control signal MC [1] is logical OR signal between global control signals G_MCT and GS_MCT generated by OR circuit 608 and local control signal MCT [1], and controls switch transistor M5.

Subbuffer circuit 604 also has the same configuration as that of subbuffer circuit 603. Subbuffer circuit 604 generates control signals TG [2], RS [2], SL [2], and MCT [2] from local control signals RST [2], MCT [2] and SEL [2], and global control signals G_TG, GS_TG, G_RS, G_MCT and GS_MCT, and supplies these signals to pixel circuits 100 in the second row. Also, subbuffer circuit 604 distributes bias terminal voltage Vapd to pixel circuits 100 in the second row.

Also, pixel circuits 100 in the first column and pixel circuits 100 in the second column respectively supply output signal Sout [1] and output signal Sout [2] to a readout circuit or the like that is not shown in the diagram. Readout voltage Vrd and reset voltage Vrst are voltages that are supplied to pixel circuits 100 from the readout circuit, and are the same for a plurality of columns (or it may be all columns).

In solid-state image-capturing device 600c configured as described above, control signals TG [i], RS [i], SL [i], and MCT [i] are examples of the first control signal, the second control signal, the third control signal, and the fourth control signal, respectively, and a combination of timing generation circuit 609 and buffer circuit 602 is an example of the control circuit that generates the first control signal, the second control signal, the third control signal, the fourth control signal, and bias terminal voltage Vapd.

Global Electronic Shutter Driving

Figure 12:
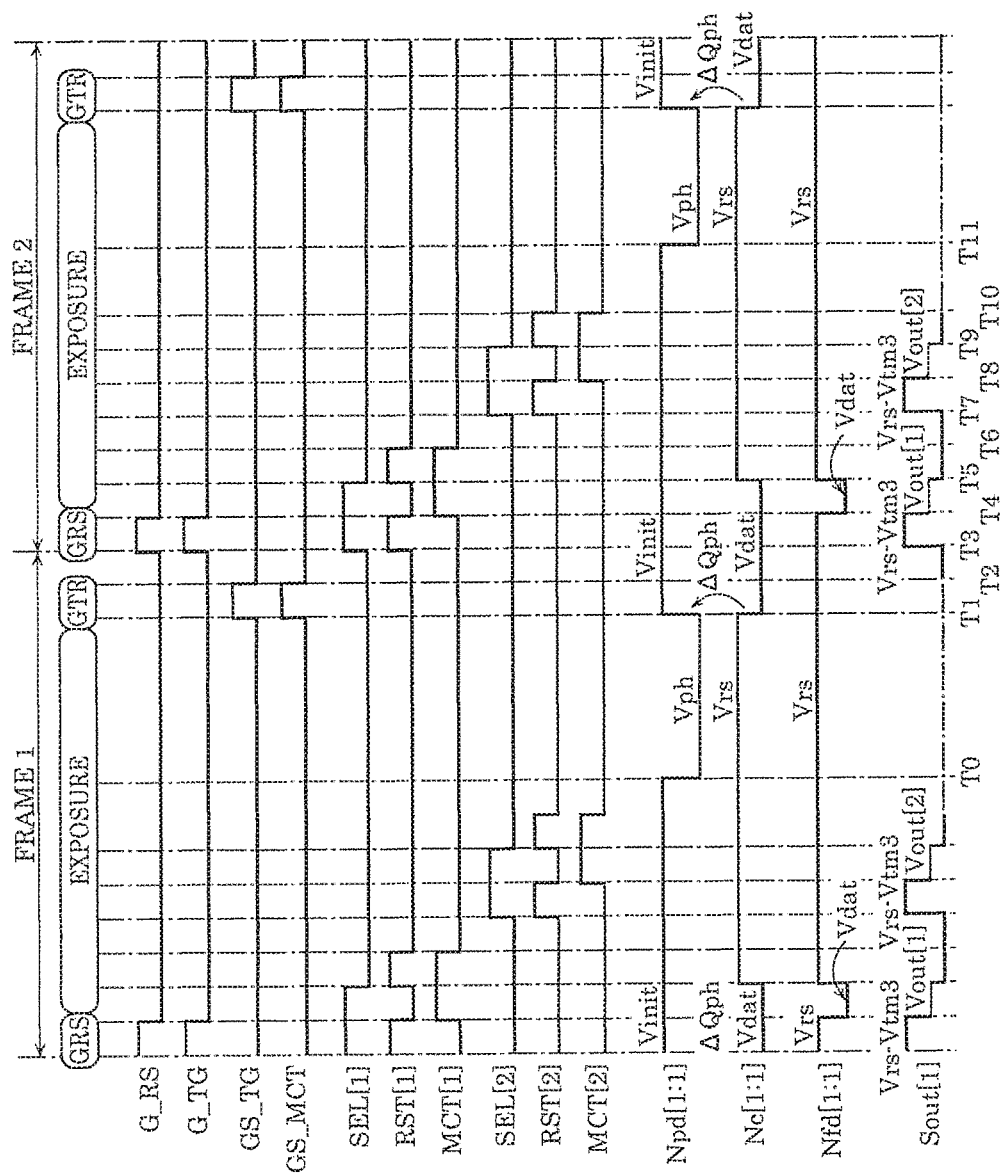
FIG. 12 is an operation waveform in Embodiment 2.

FIG. 12 shows global electronic shutter driving that can be implemented by using analog memory 105 shown in FIG. 1 as a temporary storage element for storing a detection signal. The operations will be described with reference to FIGS. 1, 11, and 12.

Because pixel circuits 100 perform the same operations, the following description will be given using only pixel circuit 100 [1:1] that is provided in the first row of the first column As an example, it is assumed that the following voltages are applied to pixel circuit 100 [1:1]: readout voltage Vrd [1]=Vdd; and reset voltage Vrst [1]=Vrs. Furthermore, it is assumed that breakdown voltage −Vb is applied to the avalanche photodiode so as to perform electron-multiplication driving.

[Time T0: Photon Detection in Frame 1]

At time T0, because global control signals G_TG and GS_TG are set to L, and control signal TG [1] is set to L, avalanche photodiode PD is in an exposed state. When photons are incident on the avalanche photodiode, the electric charges generated through photoelectric conversion are electron-multiplied. As a result, the voltage of node Npd [1:1] of pixel circuit 100 [1:1] decreases from initial voltage Vinit to Vph, and then stored (photon detection operation).

[Time T1: Global Electric Charge Transfer and Electric Charge Storage (Data Storage) in Frame 1]

At time T1, global control signals GS_TG and GS_MCT are set to H, and control signal TG in all rows and control signal MCT in all rows are set to H.

As a result, in each of all pixel circuits 100, node Nc of analog memory 105 and node Npd of avalanche photodiode PD provided in pixel circuit 100 are in an electrically conductive state. In pixel circuits 100 in which a photon incident event takes place, electric charges are supplemented from node Nc to node Npd. At the same time, node Npd is set from Vph to initial voltage Vinit, and the voltage of node Nc of analog memory 105 decreases from reset voltage Vrs to Vdat.

As a result, the electric charge transfer and electric charge storage (data storage) operations of converting the presence or absence of a photon incident event in frame 1 into a voltage and storing the voltage in analog memory 105 are performed.

[Time T2: End of Global Electric Charge Transfer in Frame 1]

At time T2, global control signals GS_TG and GS_MCT are set to L, and control signal TG in all rows and control signal MCT in all rows are set to L. As a result, the electric charge transfer operation ends in all pixel circuits. Also, electric charges are stored in analog memory 105 (data storage).

[Time T3: Global Reset in Frame 2, and Reset Readout in First Row]

At time T3, global control signals G_RS and G_TG are set to H, and control signals RST and TG of all pixel circuit 100 are set to H. As a result, in each of all pixel circuits 100, reset voltage Vrs is supplied to FD region Nfd, and node Npd of avalanche photodiode PD is again set to initial voltage Vinit (simultaneous global reset operation in all rows). Data readout starts in preceding frame (frame and the reset voltage is first read out for each row by rolling readout.

The following description will be given, focusing on pixel circuit 100 [1:1] that is provided in the first row of the first column, Local control signal RST [1] is set to H, and control signal RS [1] is set to H, As a result, FD region Nfd is set to reset voltage Vrs. Because local control signal SEL [1] is set to H, control signal SL [1] is also set to H, and Vrs−Vtm3 is output as output signal Sout [1] by source follower transistor M3.

[Time T4: Simultaneous Start of Exposure in Frame 2, and Frame 1 Signal Readout in First Row]

At time T4, global control signals G_RS and G_TG are set to L, and control signals RST and TG of all pixel circuits 100 are set to L. As a result, all pixels are simultaneously brought into an exposed state.

On the other hand, local control signal RST [1] is set to L, and MCT [1] is set to H. As a result of control signal RS [1] being set to L, and MCT [1] being set to H, the electric charges accumulated in node Nc of analog memory 105 in the preceding frame (frame 1) are transferred to FD region Nfd, and FD region Nfd has Vdat that is the same potential as node Nc. Because local control signal SEL [1] has been set to H, control signal SL [1] is also set to H, and, as output signal Sout [1], Vout [1]=Vdat−Vtm3 is output by source follower transistor M3.

[Time T5: Exposure in Frame 2, and Reset of Analog Memories in First Row]

At time T5, local control signal SEL [1] is set to L, and RST [1] and MCT [1] are set to H. As a result of control signal SL [1] being set to L, the output operation of output signal Sout [1] from pixel circuits 100 in the first row ends.

Also, as a result of control signals RS [1] and MC [1] being set to H, FD region Nfd and node Nc of analog memory 105 are initialized to reset voltage Vrs.

[Time T6: Exposure in Frame 2, and End of Readout Operation in First Row]

At time T6, local control signals RST [1] and MCT [1] are set to L, control signals RS [1] and MC [1] are set to L, and reset voltage Vrs is stored in FD region Nfd and node Nc of analog memory 105. The readout operation in the first row thereby ends.

At time T3 to time T0, by using analog memories 105 as temporary storage memories, the avalanche photodiodes provided in all pixel circuits 100 can be simultaneously set in an exposed state (global reset operation). Furthermore, data in the preceding frame can be read out for each row in the background during the exposure period (rolling readout).

Because the data in the preceding frame can be read out as background processing of the current frame, a reduction in the frame rate can be avoided.

[Time T7: Frame 2: Exposure, and Reset Readout in Second Row]

At time T7, avalanche photodiodes PD in all pixel circuits 100 are in an exposed state, and reset readout is performed in pixel circuits 100 in the second row in the same manner as the reset readout operation performed in the first row at time T3.

[Time T8: Frame 2: Exposure, and Frame 1 Signal Readout in Second Row]

At time T8, signal readout is performed in pixel circuits 100 in the second row in the same manner as the signal readout operation performed in the first row at time T4.

[Time T9: Frame 2: Exposure, and Reset of Analog Memories in Second Row]

At time T9, the operation of resetting analog memories 105 in pixel circuits 100 in the second row is performed in the same manner as the operation of resetting analog memories 105 in the first row performed at time T5.

[Time T10: Frame 2: Exposure, and End of Readout Operation in Second Row]

At time T10, the readout operation in pixel circuits 100 in the second row ends in the same manner as the readout operation in the first row performed at time T6.

[Time T11: Frame 2: Photon Detection]

At time T11, the readout operation has finished in pixel circuits 100 in all rows, and thus pixel circuits 100 are again brought into an exposed state. This operation is the same as that performed at time T0, and is repeated.

Here, a photon incident event can be detected during the exposure period.

Overall Operations of Global Electronic Shutter

Figure 13:
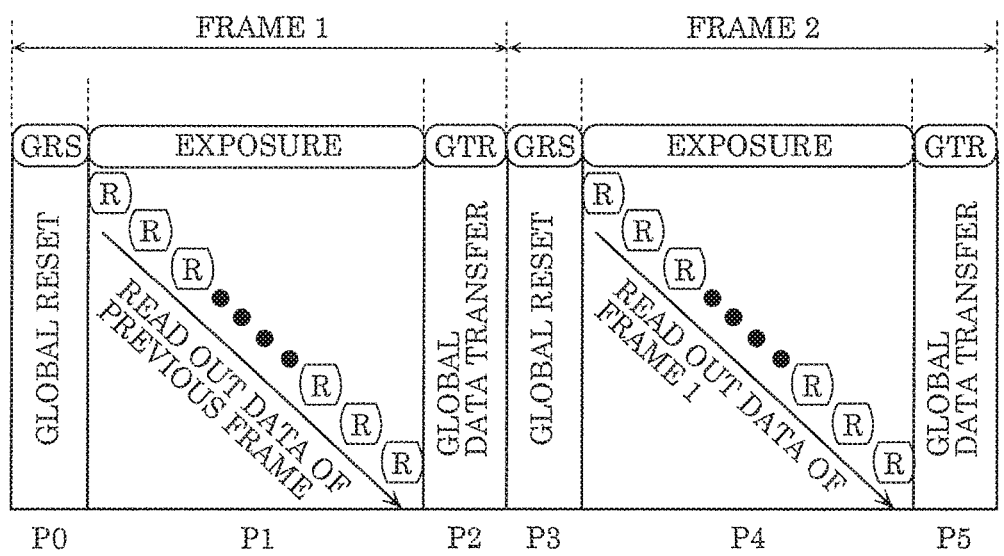
FIG. 13 is an operational diagram in Embodiment 2.

FIG. 13 shows a primary part of overall operations of a global electronic shutter.

The operations of the pixel circuits in frame 1 include global reset GRS, exposure, preceding frame data readout, and global data transfer GTR.

During period P0, a global reset operation for simultaneously resetting all pixel circuits is performed. At the same time, reset readout in the first row is performed, and a rolling readout operation starts.

During period P1, the avalanche photodiodes in all pixel circuits are simultaneously brought into an exposed state. At the same time, the data accumulated in the analog memories in the preceding frame are read out by rolling readout.

During period P2, global data transfer is performed to transfer the electric charges generated in the avalanche photodiodes PD by exposure to the analog memories.

The operations in frame 1 may end when the global data transfer ends. The same operations are repeated in frame 2 and the subsequent frames.

Advantageous Effect

In solid-state image-capturing device 600c described above, global electronic shutter imaging can be implemented by using analog memories 105 of pixel circuits 100 as temporary storage memories.

Also, a series of operations of resetting the voltage of the avalanche photodiode, performing exposure, and transferring the electric charges generated by the avalanche photodiode to the analog memory are simultaneously performed on a plurality of rows or all rows. Accordingly, the voltage of the analog memory stored in the preceding frame is read out for each row in the current frame, and thus the readout time can be apparently eliminated, and the reduction in the frame rate can be suppressed.

Binary Driving for One-Shot Photon Counting Mode

Figure 14:
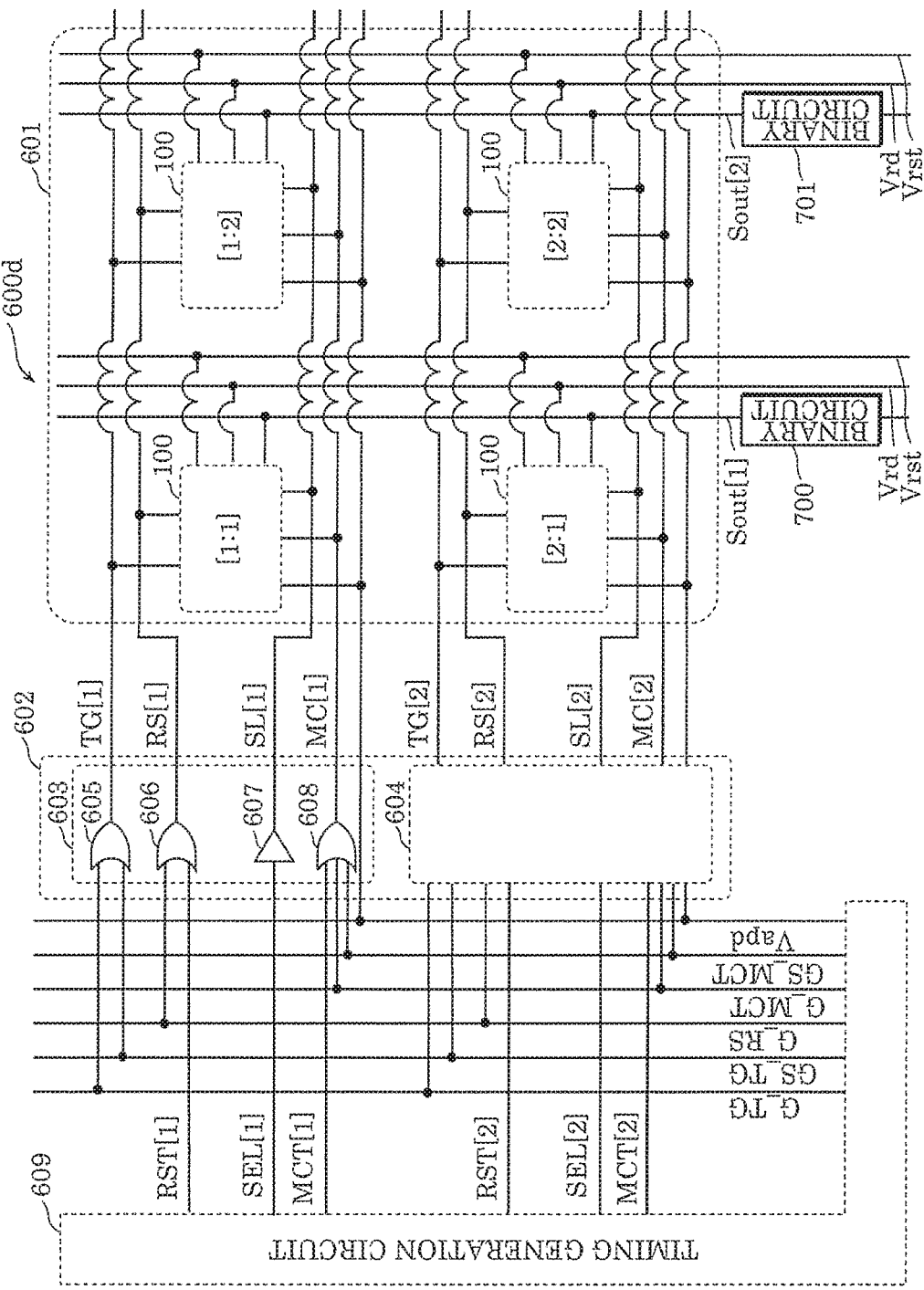
FIG. 14 is a block diagram of a solid-state image-capturing device according to a variation.

FIG. 14 is a block diagram showing an example of a configuration of solid-state image-capturing device 600d that is a solid-state image-capturing device according to a variation. Solid-state image-capturing device 600d includes binary circuits 700 and 701 in the outputs (for example, Sout [1] and Sout [2]) provided for each column of solid-state image-capturing device 600c shown in FIG. 11.

In the case of detecting only a single photon incident event in the photon counting mode, it is only necessary that output Sout of pixel circuit 100 has two values: High and Low. Accordingly, binary circuits 700 and 701 are used to set Low level and High level of output Sout to fixed values. There is no particular limitation on the configuration of binary circuits 700 and 701. For example, binary circuits 700 and 701 may have a circuit configuration that constantly outputs 0 or a saturated voltage by using the configuration of a column amplifier that is commonly used in a CMOS image sensor.

Also, the configuration of pixel circuit 100 is not limited thereto. It is also possible to binarize and digitally output a single photon incident event in a pixel circuit that includes a reset transistor, a source follower transistor, a selection transistor, and an avalanche photodiode, as well as in a pixel circuit obtained by adding a transfer transistor between the avalanche photodiode and the source follower transistor. That is, by using binary circuits provided in vertical signal lines, it is possible to binarize and digitally output the voltage generated by the pixel circuits irrespective of the configuration of the pixel circuits.

With this configuration, in the case of detecting only a single photon incident event, it is unnecessary to provide the binary function in each pixel. Accordingly, the pixel circuit can be miniaturized, and the number of pixels can be increased. Also, because the binary function is provided in each column and is used in a shared manner, it is also possible to suppress circuit variation between pixels. In addition, because it is unnecessary to provide the binary function in each pixel, as can be seen from the above-described pixel circuit that includes three transistors or four transistors, the pixel circuit can be easily shared between the electric charge accumulation mode and the photon counting mode in which only a single photon incident event is detected, and switching can be easily performed between the two modes.

Embodiment 3

In Embodiment 3, a solid-state image-capturing device that binarizes and digitally outputs the voltage generated by the pixel circuits will be described by taking another example.

Figure 15:
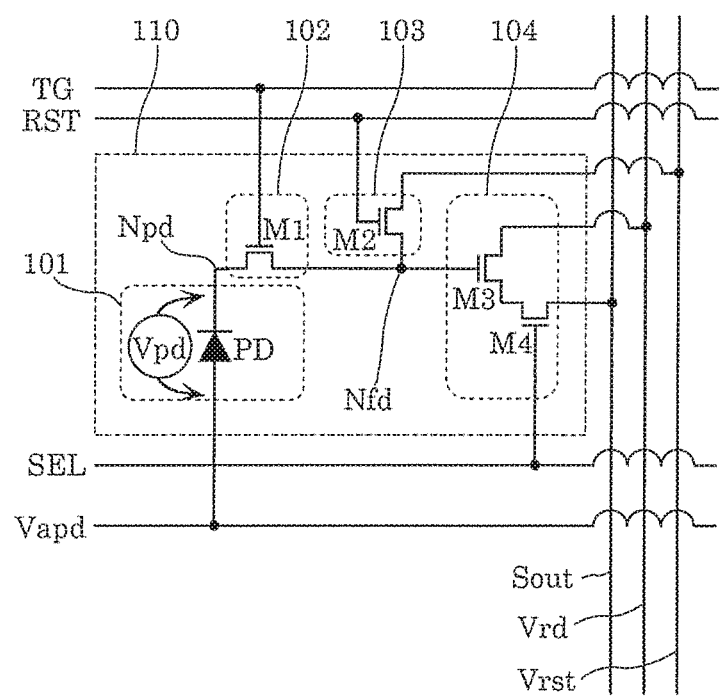
FIG. 15 is a circuit diagram showing an example of a configuration of a pixel circuit according to Embodiment 3.

FIG. 15 is a circuit diagram showing an example of a configuration of pixel circuit 110. Pixel circuit 110 and pixel circuit 100 in FIG. 1 are common in that avalanche photodiode PD is used as a photoelectric conversion element, while being different in that analog memory 105 is omitted in pixel circuit 110. It is sufficient that pixel circuit 110 is a pixel circuit that reads out an analog signal obtained through multiplication of the electric charges. In a yet another example of pixel circuit 110, transfer circuit 102 may be further omitted and avalanche photodiode PD and source follower transistor M3 may be directly connected.

Figure 16:
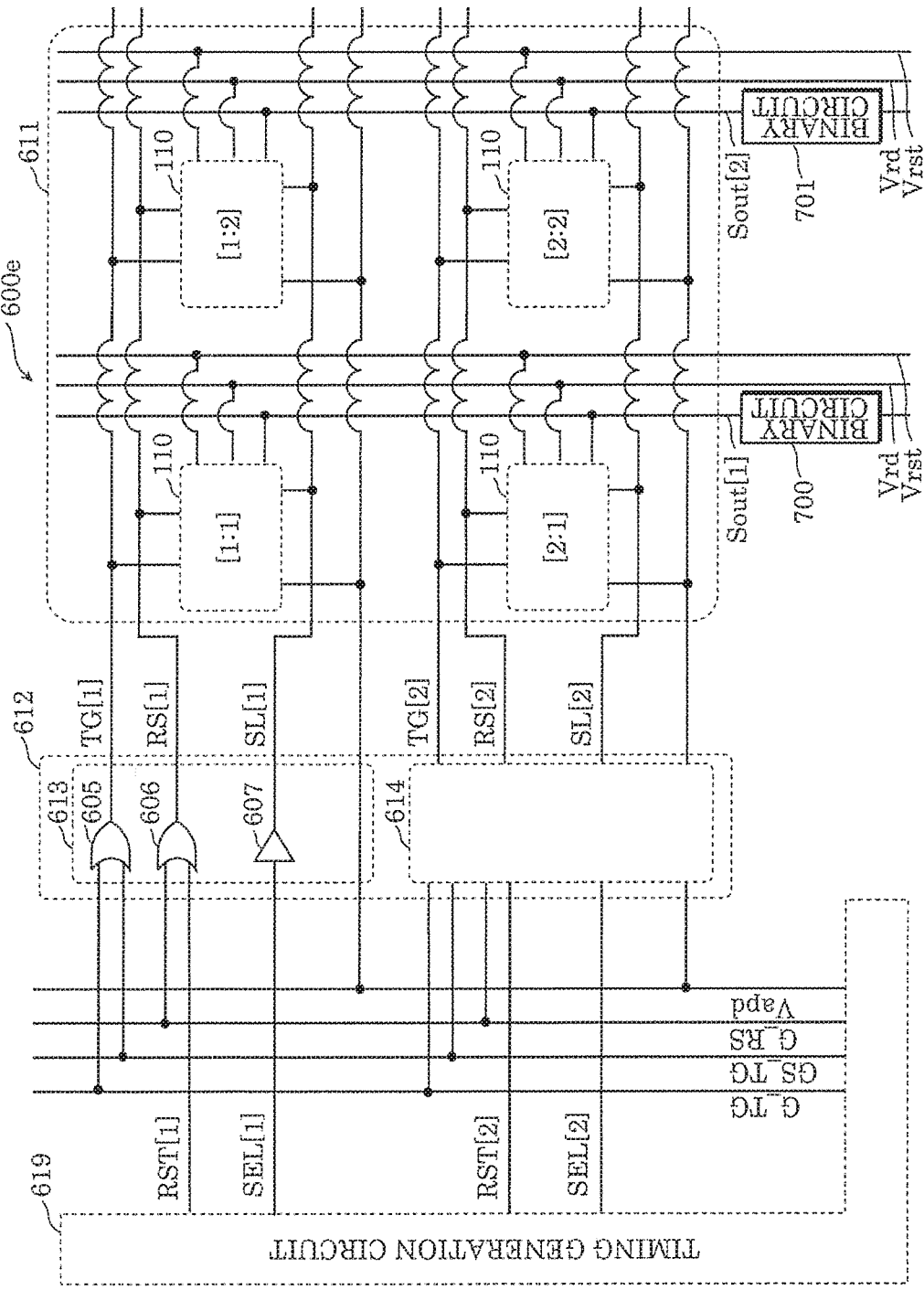
FIG. 16 is a block diagram of a solid-state image-capturing device according to Embodiment 3.

FIG. 16 is a block diagram showing an example of a configuration of a relevant part of solid-state image-capturing device 600e that includes a plurality of pixel circuits 110.

Solid-state image-capturing device 600e includes: pixel array 611 that includes a plurality of pixel circuits 110 that are arranged in rows and columns; buffer circuit 612; timing generation circuit 619; and binary circuits 700 and 701 provided for each column. Buffer circuit 612 includes sub-buffer circuits 613 and 614 that have the same configuration and are provided in respective rows.

Since the analog memory is omitted from pixel circuit 110, in solid-state image-capturing device 600e, the configurations provided for controlling the analog memory are omitted. Specifically, solid-state image-capturing device 600e is configured without local control signals MCT [i] and MC [i], global control signals G_MCT and GS_MCT, and OR circuit 608, as compared with solid-state image-capturing device 600d in FIG. 14.

Next, the operations of solid-state image-capturing device 600e will be described using an example of one-shot photon counting mode.

Figure 17:
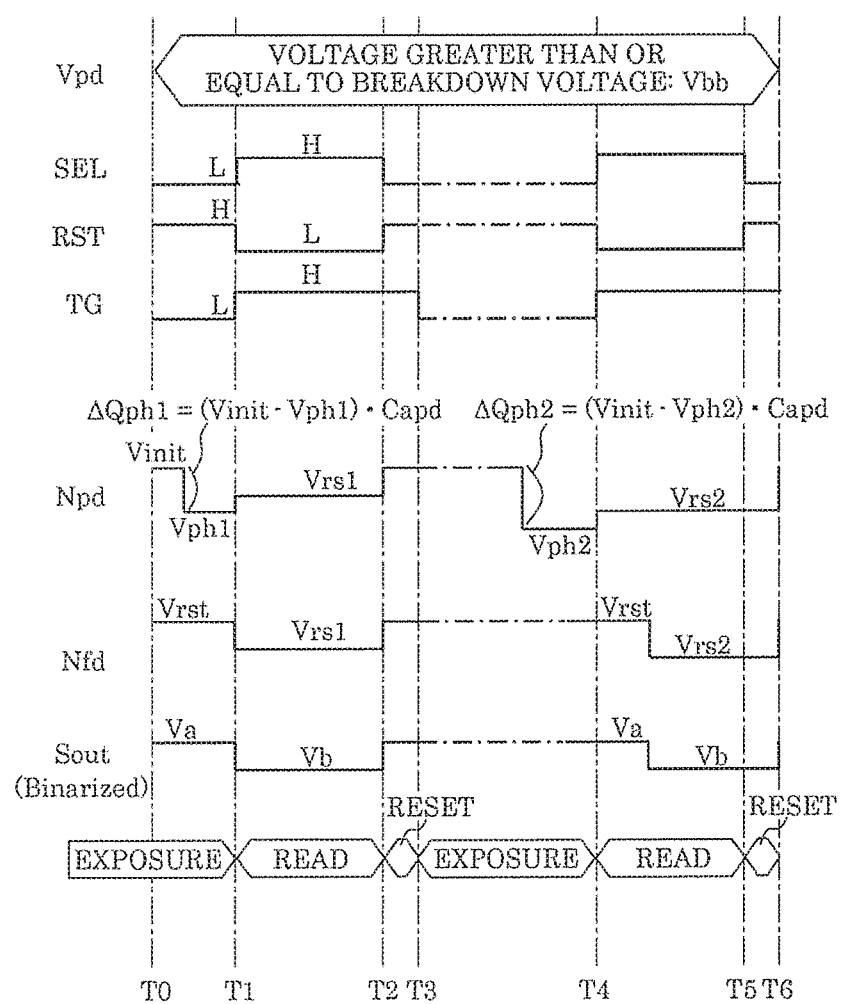
FIG. 17 is an operation waveform in Embodiment 3.
Figure 18:
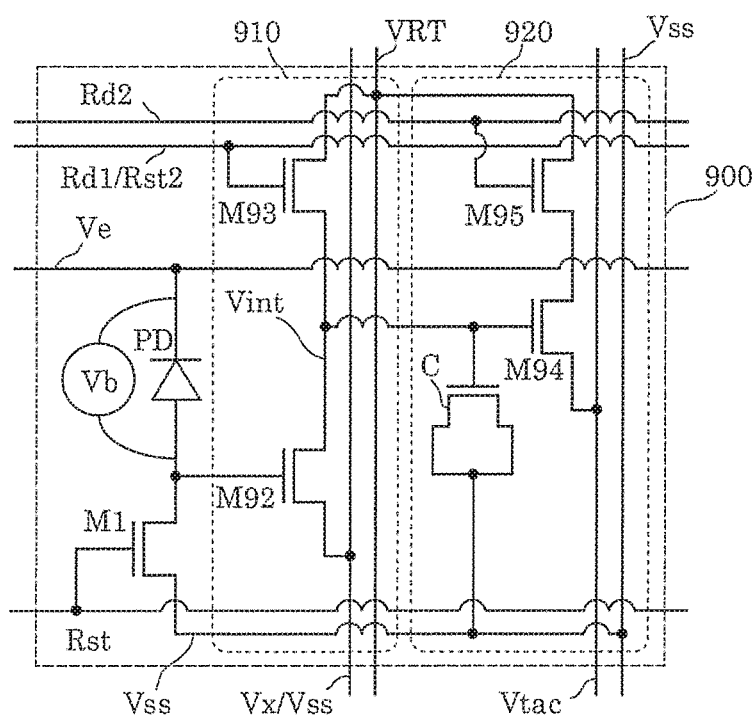
FIG. 18 is a circuit diagram showing an example of a configuration of a multimode photo-detector according to a conventional technique.

FIG. 17 is a timing chart showing an example of the operation of solid-state image-capturing device 600e, and shows one-shot photon counting for two times performed by pixel circuits 110 which are the same or different from each other. In the period shown in FIG. 17, avalanche photodiode PD is applied with voltage Vbb that is greater than or equal to the breakdown voltage, and the electric charges generated through photoelectric conversion are electron-multiplied.

[Time T0: Exposed State]

When photons are incident on avalanche photodiode PD in the exposed state, the electric charges generated through photoelectric conversion are electron-multiplied. Here, when it is assumed that photons ate incident, avalanche photodiode PD generates the electric charges in amount of ΔQph1 that corresponds to the difference between initial voltage Vinit and voltage Vph1 obtained by electron-multiplication of the electric charges.

[Time T1: Readout State]

As a result of transfer transistor M1 being in a conductive state, the electric charges generated by avalanche photodiode PD are transferred to node Nfd, and readout voltage Vsr1 at node Nfd is determined.

Output signal Sout corresponding to readout voltage Vsr1 is supplied from pixel circuit 110 to the binary circuit via the vertical signal lines. In the binary circuit, output signal Sout is binalized to voltage Va and voltage Vb, and is output as a binary signal.

[Time T2: Reset State]

As a result of reset transistor M2 being in a conductive state, node Nfd and avalanche photodiode PD are set to a reset state.

[Time T3: Exposed State]

Solid-state image-capturing device 600e becomes the exposed state again, and the operations from time T0 are repeated. Here, when it is assumed that photons ate incident, avalanche photodiode PD generates the electric charges in an amount of ΔQph2 that corresponds to the difference between initial voltage Vinit and voltage Vph2 obtained by electron-multiplication of the electric charges.

It is possible that the amount of electric charges ΔQph1 generated in the exposed state from time T0 and the amount of electric charges ΔQph2 generated in the exposed state from time T3 are different.

[Time T4: Readout State]

As a result of transfer transistor M1 being in a conductive state, readout voltage Vsr2 at node Nfd is determined.

Output signal Sout corresponding to readout voltage Vsr2 is supplied from pixel circuit 110 to the binary circuit via the vertical signal lines. In the binary circuit, output signal Sout is binalized to voltage Va and voltage Vb and output as a binary signal. It is to be noted that the amplitude (Va−Vb) of the binary signal may be greater or smaller than the amplitude of the readout voltage at node Nfd.

[Time T5: Reset State]

As a result of reset transistor M2 being in a conductive state, node Nfd and avalanche photodiode PD are set to a reset state.

With the above-described operation, solid-state image-capturing device 600e can binalize and digitally output the voltage generated based on electron-multiplication of the electric charges by avalanche photodiode PD in the pixel circuits. Furthermore, it is unnecessary to provide an analog memory to each pixel. Accordingly, the pixel circuit can be miniaturized, and the number of pixels can be increased.

It is to be noted that the above-described operation is an example for explanation, and any other operation that is a sequence for driving a pixel circuit that outputs output signal Sout based on electron-multiplication of the electric charges by avalanche photodiode PD. For example, the reset signal may be read out in the reset state and CDS may be performed with the signal read out in the exposed state. Furthermore, it is sufficient that the binary circuit is a circuit that outputs a binary digital signal having a constant amplitude from output signal Sout of the pixel circuit, and its circuit configuration is not limited to a specific circuit configuration.

The solid-state image-capturing devices according to several aspects of the present disclosure have been described above by way of embodiments, but the present disclosure is not limited to the embodiments given above. The present disclosure may also encompass embodiments obtained by making various modifications that can be conceived by a person having ordinary skill in the art to the above embodiments, as well as embodiments implemented by any combination of the structural elements of the different embodiments without departing from the gist of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

Industrial Applicability

The solid-state image-capturing device according to the present disclosure can be widely used as an image or video capturing apparatus.

What is claimed is:

1. A solid-state image-capturing device comprising:
a pixel array including a plurality of pixel circuits arranged in rows and columns,
wherein each of the plurality of pixel circuits includes:
a photoelectric conversion element that generates an electric charge through photoelectric conversion between a bias terminal and a first node, and multiplies the electric charge according to a bias voltage applied via the bias terminal and the first node;
a transfer circuit that electrically connects the first node to a second node according to a first control signal;
a reset circuit that applies a reset voltage to the second node according to a second control signal;
an output circuit that reads out a voltage of the second node according to a third control signal; and
an analog memory that electrically connects to the second node according to a fourth control signal; and
a control circuit that generates the first control signal, the second control signal, the third control signal, the fourth control signal, and a bias terminal voltage that is applied to the bias terminal,
wherein in a first mode, the control circuit applies, to the photoelectric conversion element, the bias voltage that is less than a breakdown voltage at which multiplication of the electric charge occurs, and electrically disconnects the analog memory from the second node, and
in a second mode, the control circuit applies, to the photoelectric conversion element, the bias voltage that is greater than or equal to the breakdown voltage, and electrically connects the analog memory to the second node.

2. The solid-state image-capturing device according to claim 1, wherein in the second mode, the output circuit counts a total number of photon incident events that took place in the photoelectric conversion element by changing an electric charge accumulated in the analog memory.

3. The solid-state image-capturing device according to claim 1,
wherein in the first mode, the output circuit reads out the voltage of the second node dependent on an electric charge accumulated in the first node, and
in the second mode, the output circuit reads out the voltage of the second node dependent on an electric charge accumulated in the analog memory.

4. The solid-state image-capturing device according to claim 1,
wherein in the second mode,
the control circuit supplements the electric charge multiplied by the photoelectric conversion element for each optical detection event from the analog memory to the photoelectric conversion element via the transfer circuit, and
the voltage of the second node according to the electric charge accumulated in the analog memory is read out by the output circuit before and after the supplement of the electric charge.

5. The solid-state image-capturing device according to claim 1,
wherein the control circuit continuously performs the first mode and the second mode on one pixel circuit,
the solid-state image-capturing device further comprising:
a computation circuit that calculates a weighted sum of the voltage of the second node read out from the pixel circuit in the first mode and the voltage of the second node read out from the pixel circuit in the second mode.

6. The solid-state image-capturing device according to claim 1,
wherein the control circuit performs:
global reset of simultaneously setting the first nodes of the plurality of pixel circuits that are arranged in a plurality of rows to an initial voltage;
global exposure of, after the global reset, performing photoelectric conversion in the photoelectric conversion elements of the plurality of pixel circuits during a same period;
rolling readout of reading out, for each row, the voltages of the second nodes according to the electric charges accumulated in the analog memories of the plurality of pixel circuits in a preceding frame while performing the global exposure; and
global transfer of, after the rolling readout, simultaneously transferring the electric charges accumulated in the first nodes of the plurality of pixel circuits in a current frame to the analog memories.

7. The solid-state image-capturing device according to claim 1, further comprising:
a column gain circuit that is provided for each column, and amplifies, in the second mode, an output signal of the plurality of pixel circuits provided in the column to a binary digital signal that varies between a first voltage and a second voltage.

8. The solid-state image-capturing device according to claim 7, wherein in the first mode, the column gain circuit amplifies the output signal to a constant multiple.

9. A method for driving a solid-state image-capturing device,
the solid-state image-capturing device including a pixel array including a plurality of pixel circuits arranged in rows and columns,
each of the plurality of pixel circuits including:
a photoelectric conversion element that multiplies an electric charge according to a bias voltage applied;
a transfer circuit that electrically connects a first node to a second node;
a reset circuit that applies a reset voltage to the second node;
an output circuit that reads out a voltage of the second node; and
an analog memory that switches between electrical connection to and electrical disconnection from the second node,
the method comprising:
in a first mode, applying the bias voltage that is less than a breakdown voltage at which multiplication of the electric charge occurs, and electrically disconnecting the analog memory from the second node; and
in a second mode, applying the bias voltage that is greater than or equal to the breakdown voltage to the photoelectric conversion element, and electrically connecting the analog memory to the second node.

10. The method for driving a solid-state image-capturing device according to claim 9,
wherein in the first mode, the voltage of the second node according to an electric charge accumulated in the first node is read out by the output circuit, and
in the second mode, the voltage of the second node according to an electric charge accumulated in the analog memory is read out by the output circuit.

11. The method for driving a solid-state image-capturing device according to claim 9, wherein in the second mode, a total number of photon incident events that took place in the photoelectric conversion element is counted by changing an electric charge accumulated in the analog memory.

12. The method for driving a solid-state image-capturing device according to claim 9,
wherein in the second mode,
the electric charge multiplied by the photoelectric conversion element for each optical detection event is supplemented from the analog memory to the photoelectric conversion element via the transfer circuit, and
the voltage of the second node according to the electric charge accumulated in the analog memory is read out by the output circuit before and after the supplement of the electric charge.

13. The method for driving a solid-state image-capturing device according to claim 9,
wherein the first mode and the second mode are continuously performed on one pixel circuit, and
a weighted sum of the voltage of the second node read out from the pixel circuit in the first mode and the voltage of the second node read out from the pixel circuit in the second mode is calculated.

14. A solid-state image-capturing device comprising:
a pixel array including a plurality of pixel circuits arranged in rows and columns,
wherein each of the plurality of pixel circuits includes:
a photoelectric conversion element that generates an electric charge through photoelectric conversion between a bias terminal and a first node, and multiplies the electric charge according to a bias voltage applied via the bias terminal and the first node;
a transfer circuit that electrically connects the first node to a second node according to a first control signal;
a reset circuit that applies a reset voltage to the second node according to a second control signal; and
an output circuit that reads out a voltage of the second node according to a third control signal; and
a control circuit that generates the first control signal, the second control signal, the third control signal, the fourth control signal, and a bias terminal voltage that is applied to the bias terminal,
wherein the solid-state image-capturing device further comprises a binary circuit that is provided for each column, and amplifies an output signal of the plurality of pixel circuits provided in the column to a binary digital signal that varies between a first voltage and a second voltage, and
wherein in a first mode, the control circuit applies, to the photoelectric conversion element, the bias voltage that is less than a breakdown voltage at which multiplication of the electric charge occurs, and electrically disconnects the analog memory from the second node, and
in a second mode, the control circuit applies, to the photoelectric conversion element, the bias voltage that is greater than or equal to the breakdown voltage, and electrically connects the analog memory to the second node.

* * * * *